US012620450B2

(12) United States Patent
Xu et al.

(10) Patent No.: US 12,620,450 B2
(45) Date of Patent: May 5, 2026

(54) ABORTED OPERATION DETECTION FOR NONVOLATILE MEMORY WITH NON-UNIFORM ERASE

(71) Applicant: Sandisk Technologies, Inc., Milpitas, CA (US)

(72) Inventors: Huiwen Xu, Cupertino, CA (US); Deepanshu Dutta, Fremont, CA (US); Ken Oowada, Fujisawa (JP); Bo Lei, San Ramon, CA (US); Ravi J. Kumar, Redwood City, CA (US); Sujjatul Islam, San Jose, CA (US); Xue Pitner, Sunnyvale, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 338 days.

(21) Appl. No.: 18/366,213

(22) Filed: Aug. 7, 2023

(65) Prior Publication Data

US 2024/0428874 A1 Dec. 26, 2024

Related U.S. Application Data

(60) Provisional application No. 63/509,134, filed on Jun. 20, 2023.

(51) Int. Cl.
G11C 29/14 (2006.01)
G11C 29/12 (2006.01)

(52) U.S. Cl.
CPC .......... G11C 29/1201 (2013.01); G11C 29/14 (2013.01); *G11C 2029/1202* (2013.01)

(58) Field of Classification Search
CPC ................ G11C 29/1201; G11C 29/14; G11C 2029/1202; G11C 29/18; G11C 29/24; G11C 29/42; G11C 16/16; G11C 16/08; G11C 16/26; G11C 29/025
See application file for complete search history.

(56) References Cited

U.S. PATENT DOCUMENTS

| | | | |
|---|---|---|---|
| 9,361,991 B1 | 6/2016 | Ng et al. | |
| 10,452,471 B2 | 10/2019 | Shen et al. | |
| 10,613,943 B2 | 4/2020 | Guo et al. | |
| 11,120,880 B1 | 9/2021 | Wang et al. | |
| 11,557,348 B1 | 1/2023 | Bhat et al. | |
| 2014/0247666 A1 | 9/2014 | Dutta et al. | |
| 2016/0172045 A1* | 6/2016 | Shukla | G11C 16/0483 365/185.11 |
| 2016/0180945 A1* | 6/2016 | Ng | G11C 15/046 365/185.11 |
| 2016/0343449 A1* | 11/2016 | Lee | G11C 16/14 |
| 2022/0399066 A1 | 12/2022 | Chen et al. | |

FOREIGN PATENT DOCUMENTS

TW 202312175 A 3/2023

* cited by examiner

*Primary Examiner* — Mohammed A Bashar
(74) *Attorney, Agent, or Firm* — Pearl Cohen Zedek Latzer Baratz LLP

(57) ABSTRACT

An apparatus includes one or more control circuits that are configured to connect to a plurality of nonvolatile memory cells. The one or more control circuits are configured to detect a first boundary between written and unwritten portions of an open block and, in response to detecting the first boundary, check for a second boundary between written and unwritten portions of the open block in order to determine if the open block was subject to a non-uniform erase operation.

20 Claims, 21 Drawing Sheets

Figure 1B:
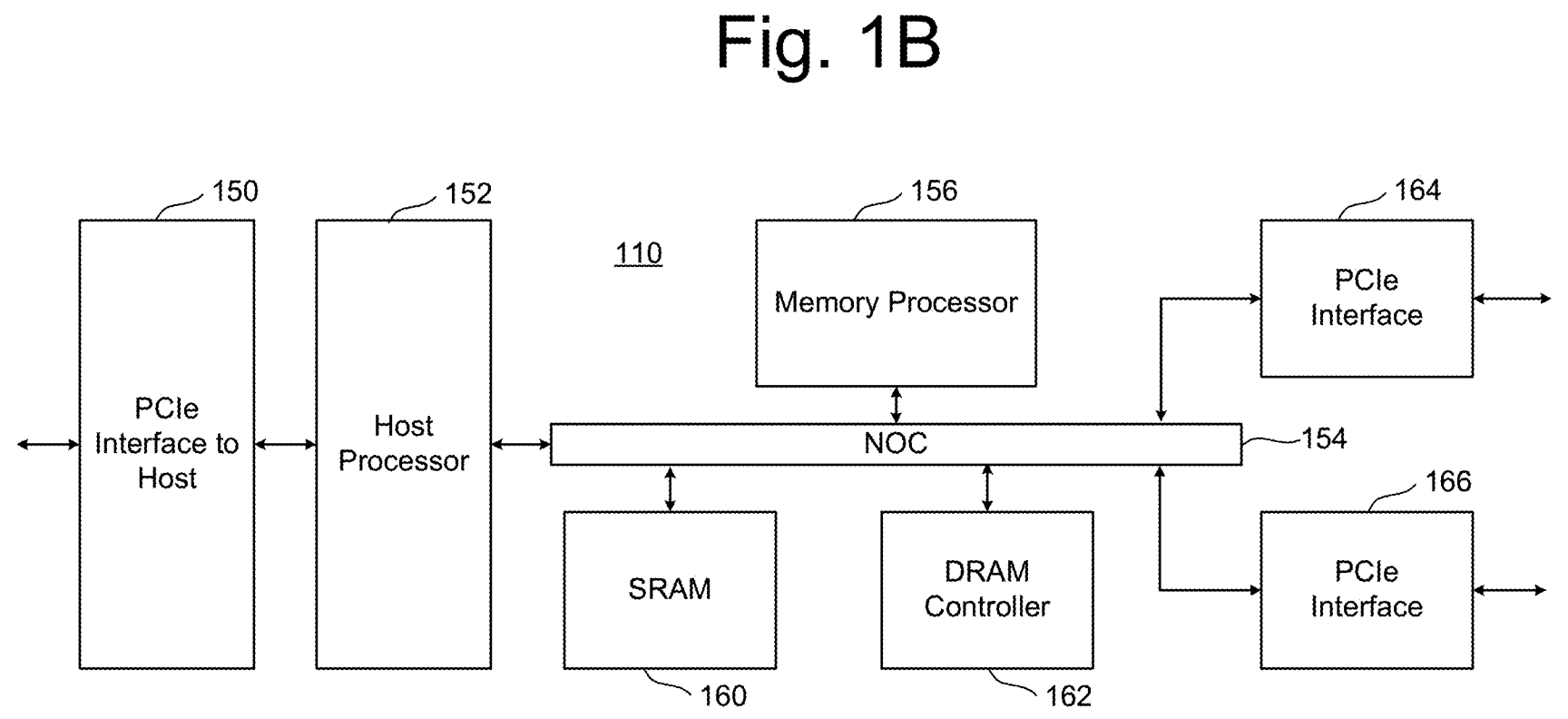

164 — PCIe Interface

166 — PCIe Interface

154 — NOC

156 — Memory Processor

162 — DRAM Controller

160 — SRAM

152 — Host Processor

150 — PCIe Interface to Host

Fig. 1C

Fig. 4C
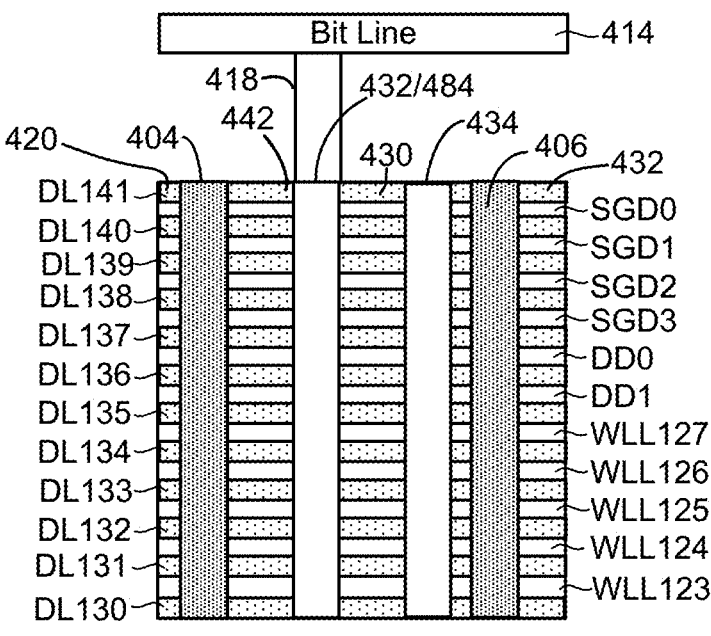

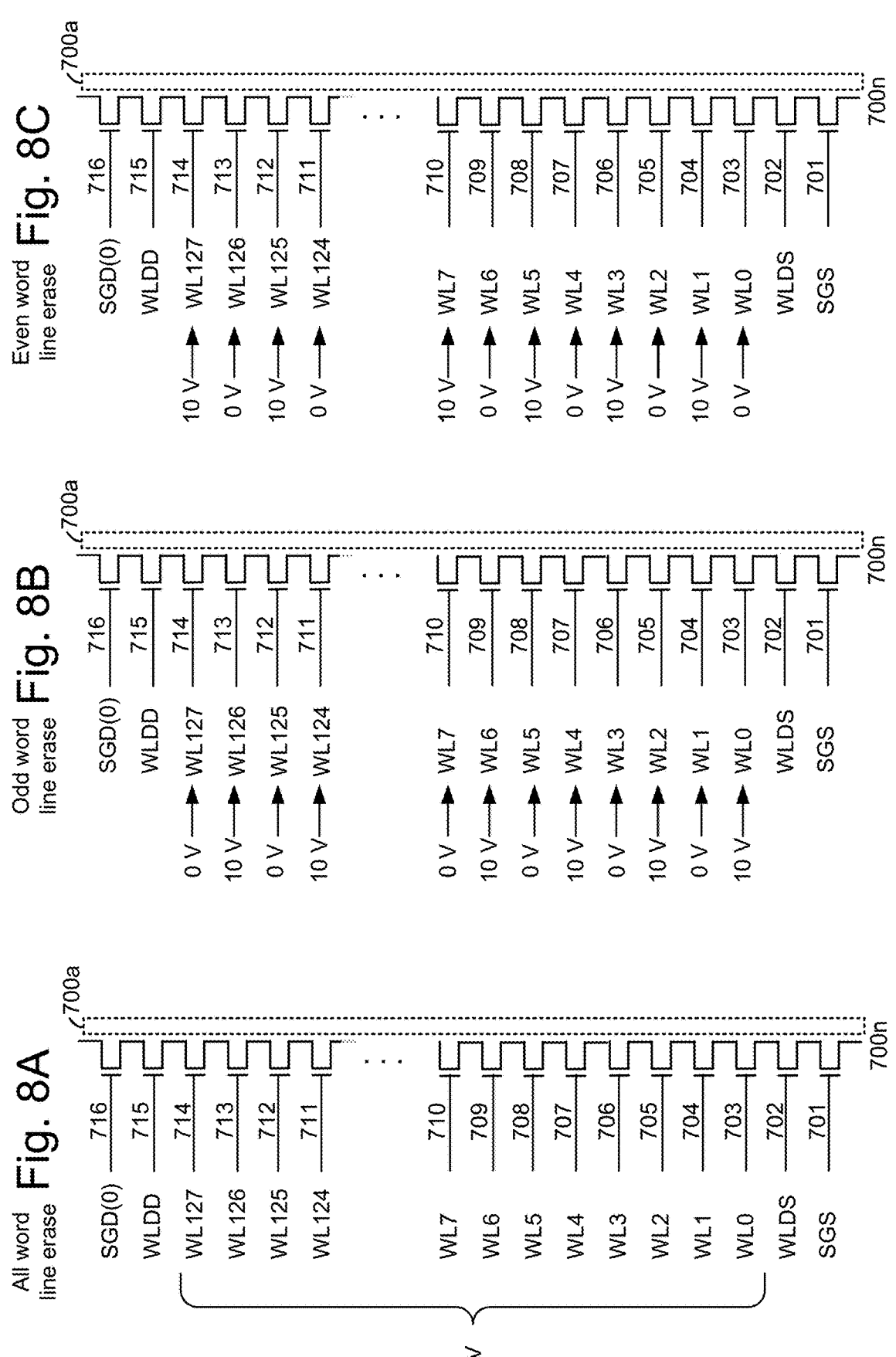

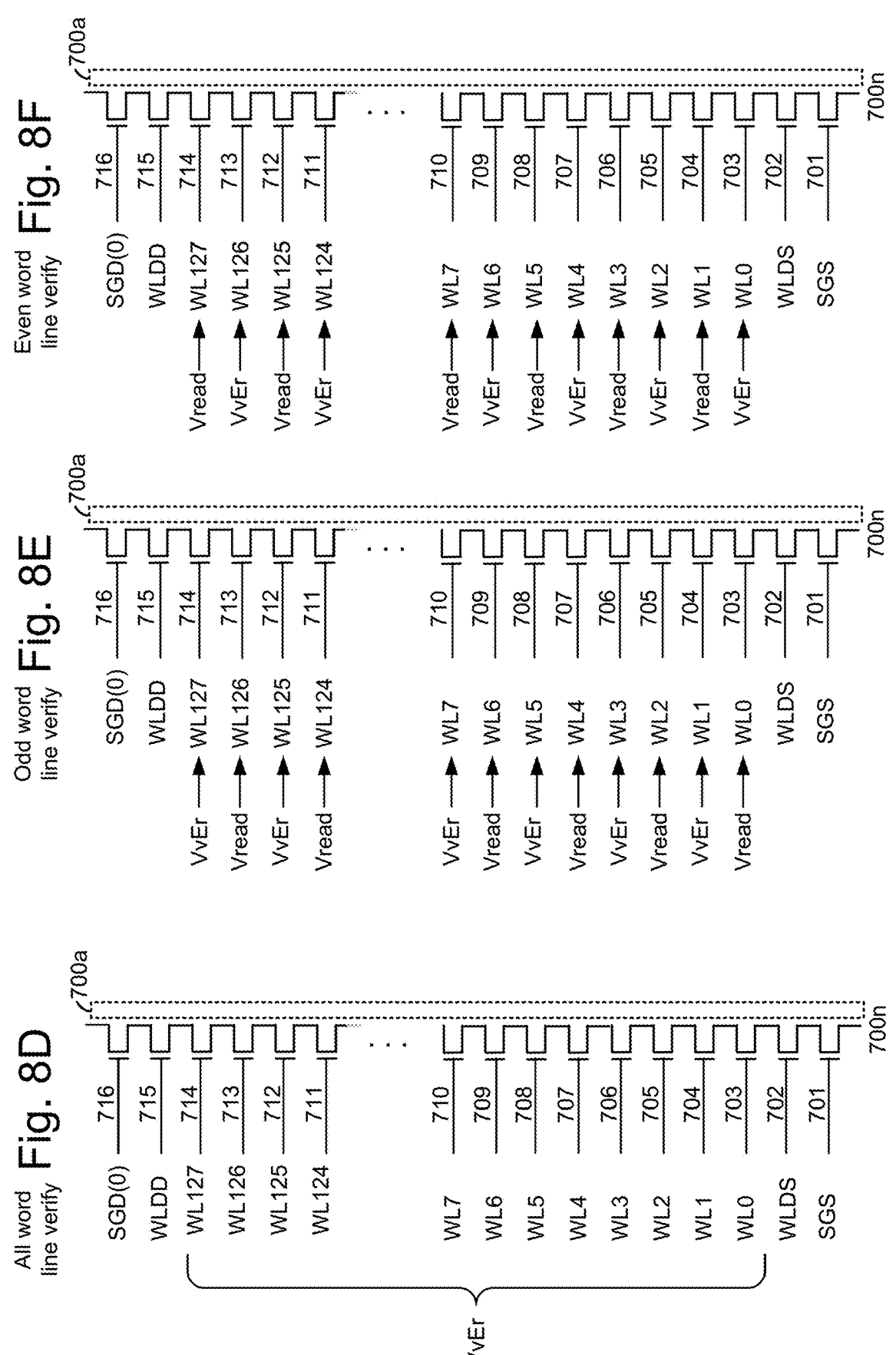

900
Fig. 9A
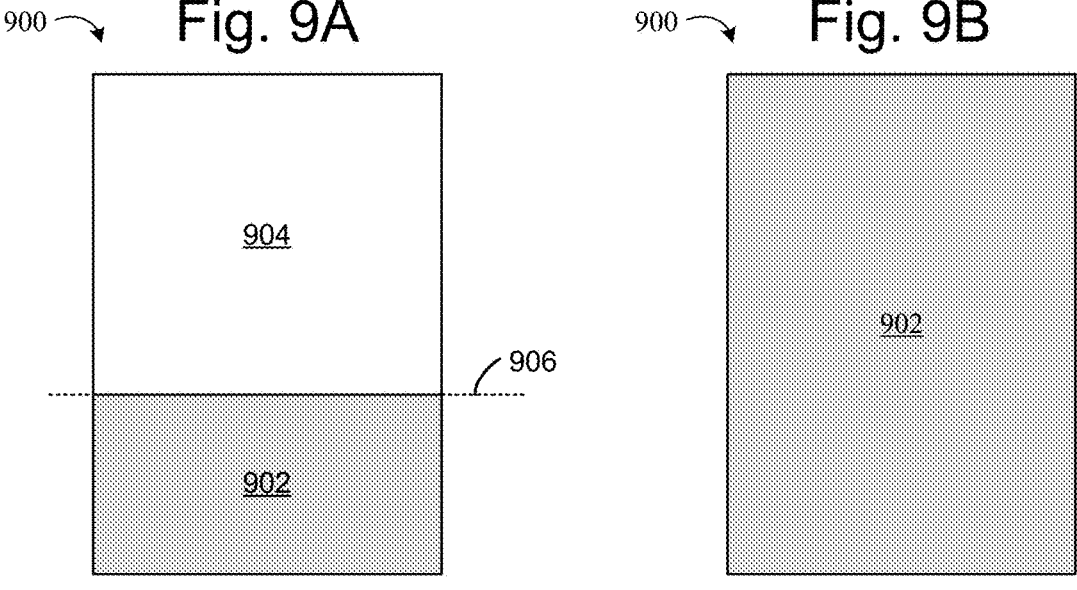
904
906
902
900
Fig. 9B
902
900
Fig. 9C
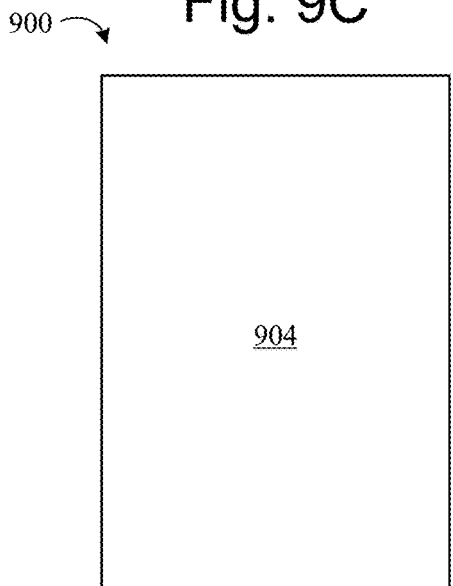
904
900
Fig. 9D
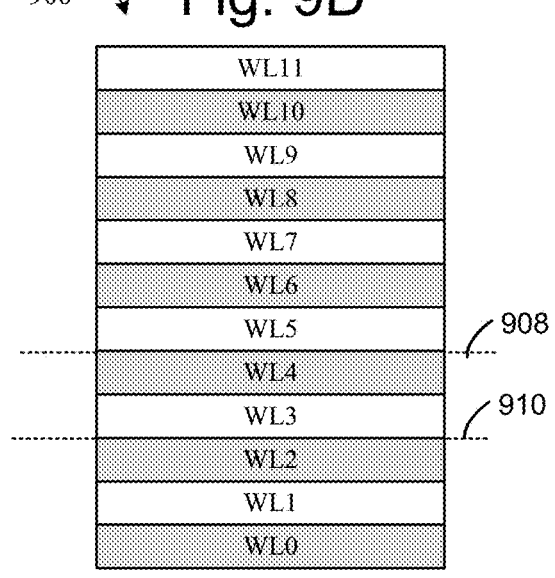
| WL11 |
| WL10 |
| WL9 |
| WL8 |
| WL7 |
| WL6 |
| WL5 |
| WL4 |
| WL3 |
| WL2 |
| WL1 |
| WL0 |
908
910

Fig. 13

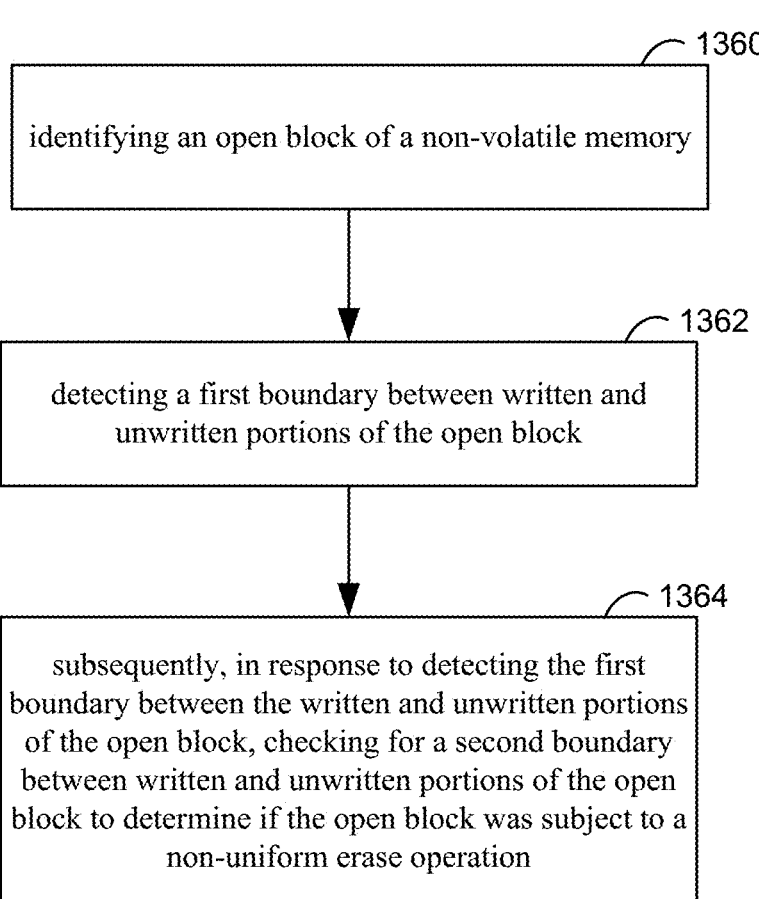

1360 identifying an open block of a non-volatile memory

1362 detecting a first boundary between written and unwritten portions of the open block

1364 subsequently, in response to detecting the first boundary between the written and unwritten portions of the open block, checking for a second boundary between written and unwritten portions of the open block to determine if the open block was subject to a non-uniform erase operation

ABORTED OPERATION DETECTION FOR NONVOLATILE MEMORY WITH NON-UNIFORM ERASE

CLAIM OF PRIORITY

The present application claims priority from U.S. Provisional Patent Application No. 63/509,134, entitled "ABORTED OPERATION DETECTION FOR NONVOLATILE MEMORY WITH NON-UNIFORM ERASE," by Xu et al., filed Jun. 20, 2023, incorporated by reference herein in its entirety.

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise nonvolatile memory or volatile memory. A nonvolatile memory allows information to be stored and retained even when the nonvolatile memory is not connected to a source of power (e.g., a battery). Examples of nonvolatile memory include flash memory (e.g., NAND-type and NOR-type flash memory), Electrically Erasable Programmable Read-Only Memory (EEPROM), and others. Some memory cells store information by storing a charge in a charge storage region. Other memory cells store information using other techniques, such as by the resistance of the memory cell. Some memories store one bit per cell using two data states (Single Level Cell or SLC) while others store more than one bit per cell using more than two data states (Multi Level Cell or MLC, which may store two bits per cell). Storing four bits per cell may use sixteen data states may (Quad Level Cell or QLC).

When a memory system is deployed in or connected to an electronic device (the host), the memory system can be used to store data and read data. For example, data may be stored in response to a program (write) command. Data may be read in response to a read command that specifies the data to be read. Data may be erased in response to an erase command. In some cases, an operation (e.g., write or erase) may be ongoing when a memory system loses power. When power returns, it may be difficult to determine the state of the memory system (e.g., some data may be partially written or partially erased).

BRIEF DESCRIPTION OF THE DRAWINGS

Like-numbered elements refer to common components in the different Figures.

FIG. 1B is a block diagram of one embodiment of a Front-End Processor Circuit. In some embodiments, the Front-End Processor Circuit is part of a Controller.

FIG. 1C is a block diagram of one embodiment of a Back End Processor Circuit. In some embodiments, the Back End Processor Circuit is part of a Controller.

FIG. 4C depicts a cross sectional view of a portion of a block of memory cells.

FIGS. 8A-F show examples of erase schemes.

FIGS. 9A-D show examples of different conditions of a block.

FIG. 13 shows an example of a method that includes checking for a second boundary in a block.

DETAILED DESCRIPTION

Techniques are disclosed herein to enable a memory system to efficiently determine the condition of a block (e.g., after an unexpected loss of power when the condition of a block may be unknown). Some memory systems use non-uniform erase, for example, separately erasing memory cells of odd and even word lines (odd-even erase), which may result in a pattern of written and unwritten portions in a block. Such patterns may result in misidentifying blocks as partially written with valid data (e.g., misidentified as write abort blocks) when they contain no valid data (e.g., are erase abort blocks). Misidentification may result in inappropriate treatment of such blocks (e.g., attempting to copy data from a block that contains no valid data) which may impact operations of a memory system.

A scheme to accurately and efficiently determine the condition of a block includes detecting a first boundary between written and unwritten portions (e.g., finding at least one written word line and at least one unwritten word line). In response to detecting the first boundary, the block may be checked for a second boundary (e.g., for an unwritten portion that is below the written word line in order of programming). A test word line (or word lines) may be selected and checked to see if it is erased. The selection of the test word line(s) may depend on a non-uniform erase scheme used. For odd-even erase, a word line immediately adjacent to a written word line may be checked (e.g., a test word line may be offset by one word line from the written word line). For other non-uniform erase schemes, test word line(s) may be differently selected. If the test word line is erased, it indicates that the block is partially erased by a non-uniform erase (erase abort block) and the block may be treated accordingly (e.g., block prepared for use without copying data or maintaining data in the block). If the test word line is not erased, it indicates that the block is partially written and includes valid data (write erase abort) and the block may be treated accordingly (e.g., copying data or continuing programming and maintaining data in the block).

Figure 1A:
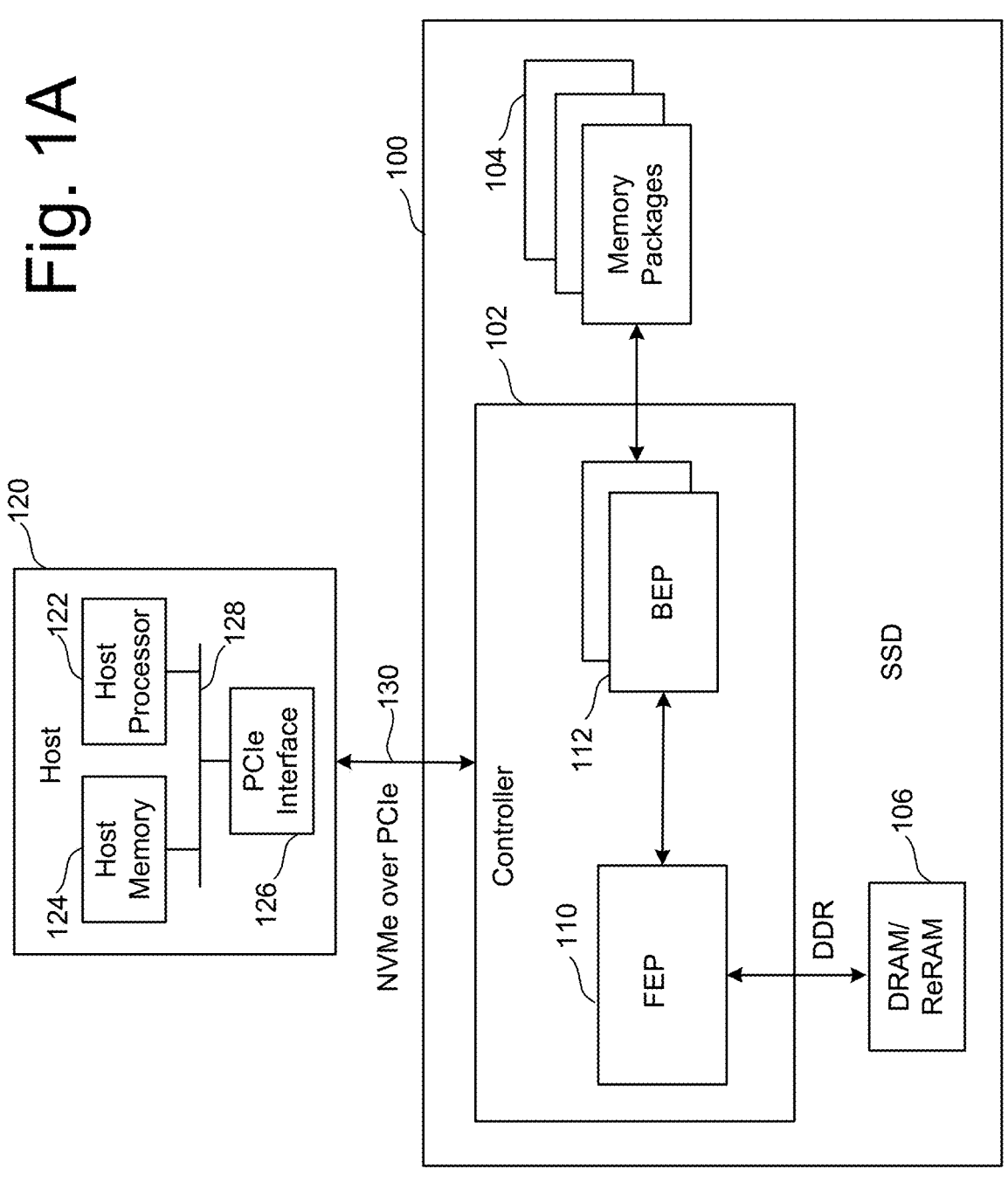
FIG. 1A is a block diagram of one embodiment of a memory system connected to a host.

FIG. 1A is a block diagram of one embodiment of a memory system 100 connected to a host 120. Memory system 100 can implement the technology proposed herein. Many different types of memory systems can be used with the technology proposed herein. One example memory system is a solid-state drive ("SSD"); however, other types of memory systems can also be used. Memory system 100 comprises a Controller 102, nonvolatile memory 104 for storing data, and local memory (e.g., DRAM/ReRAM) 106. Controller 102 comprises a Front-End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP circuit 110 and BEP 112 work as a master slave configuration where the FEP circuit 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other nonvolatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, nonvolatile memory 104 comprises a plurality of memory packages. Each memory package includes one or more memory die. Therefore, Controller 102 is connected to one or more nonvolatile memory die. In one embodiment, each memory die in the memory packages 14 utilize NAND flash memory (including two-dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, nonvolatile memory or another type of storage. Host 120 is external to and separate from memory system 100. In one embodiment, memory system 100 is embedded in host 120.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
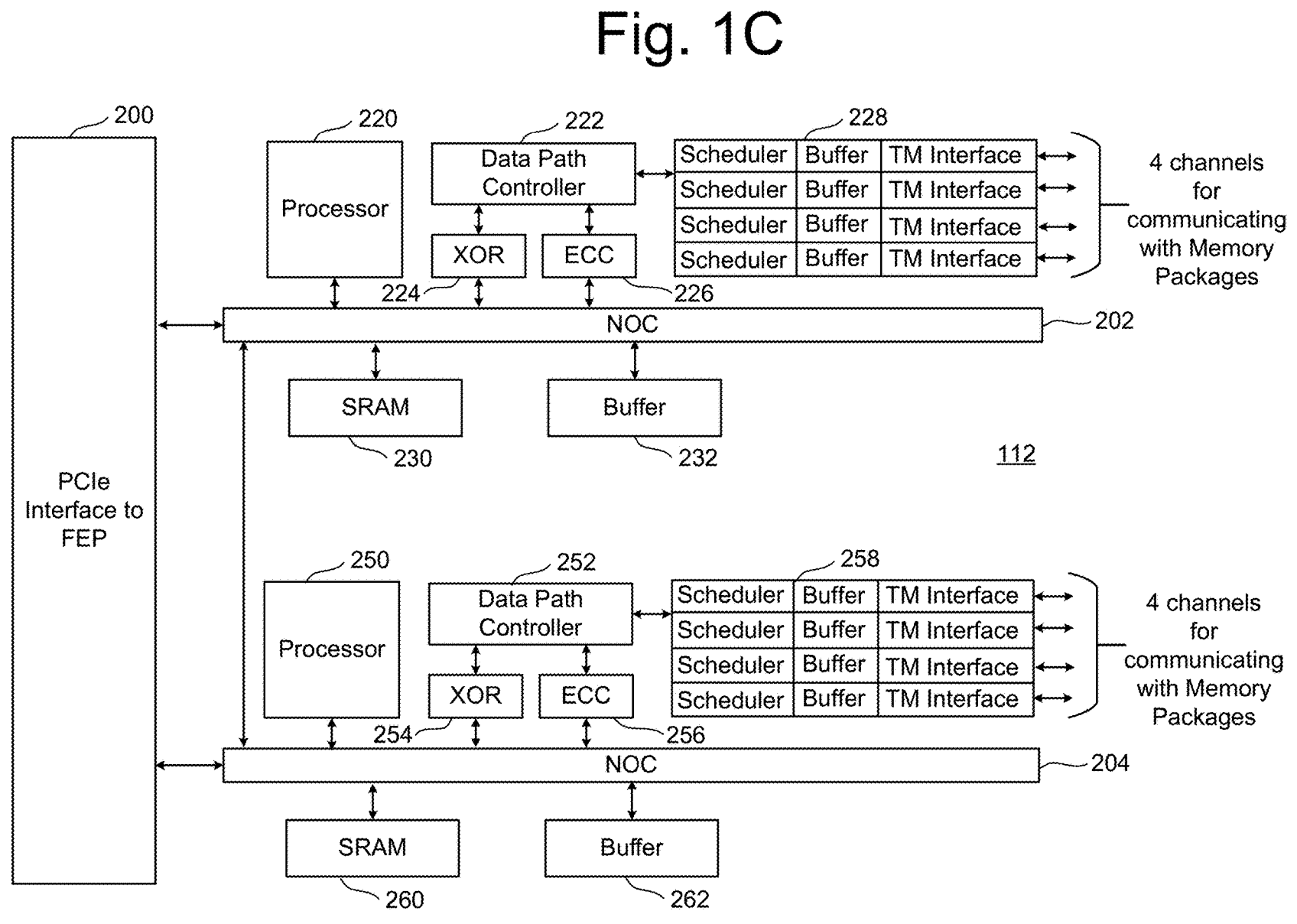

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
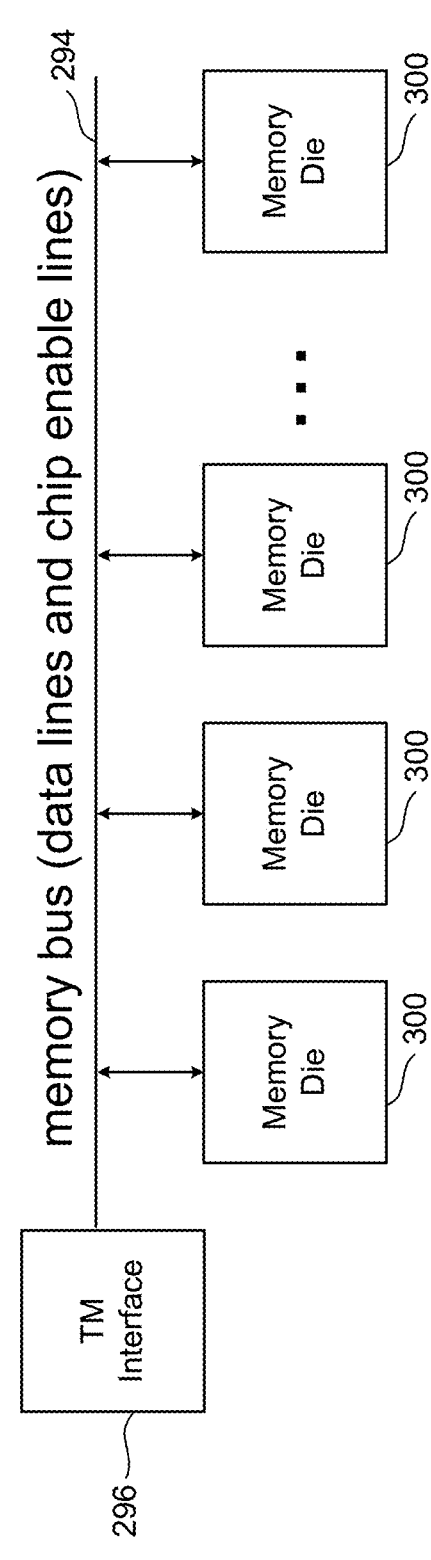
FIG. 1D is a block diagram of one embodiment of a memory package.

FIG. 1D is a block diagram of one embodiment of a memory package 104 that includes a plurality of memory die 300 connected to a memory bus 294 (data lines and chip enable lines). The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2A:
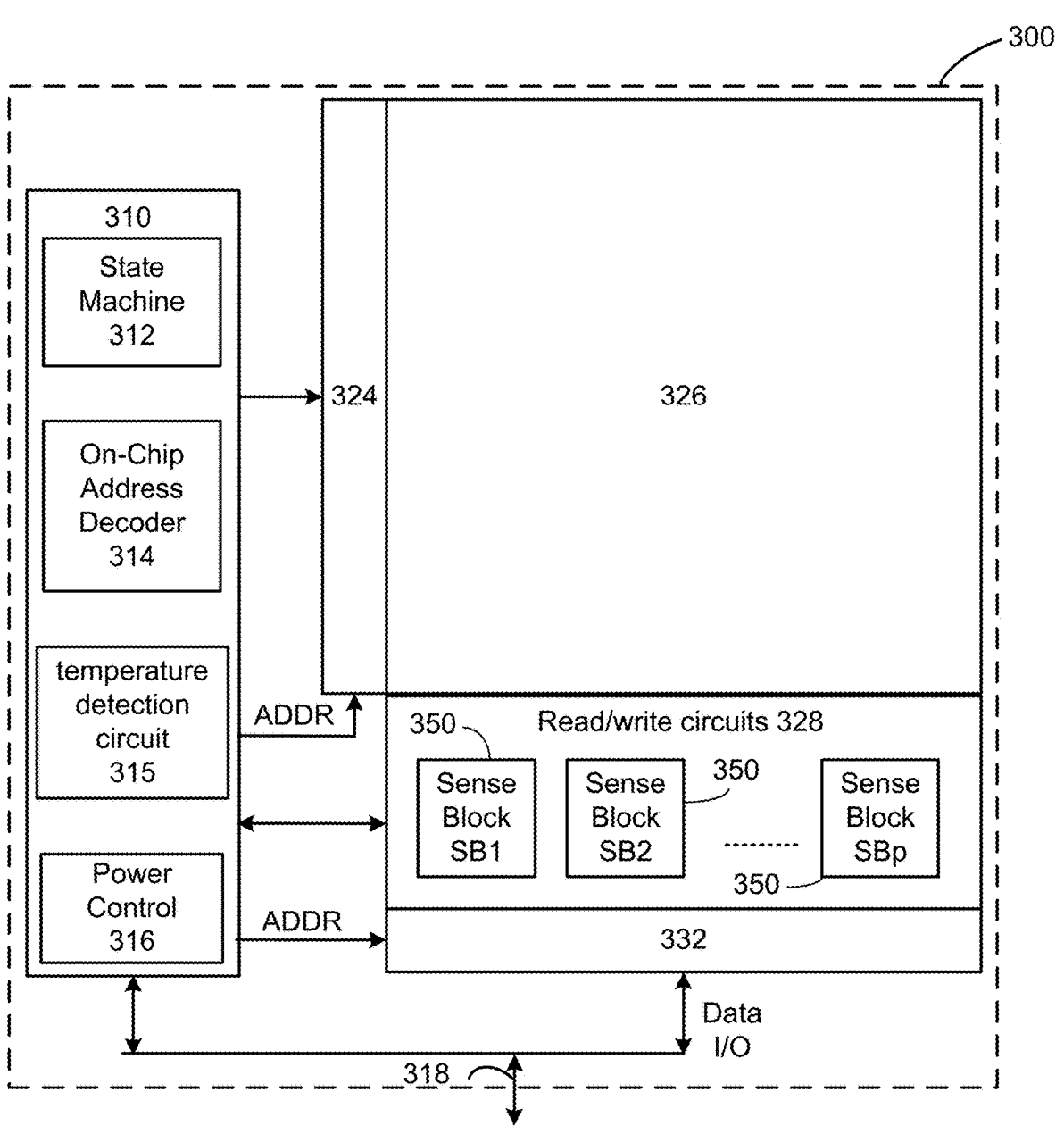
FIG. 2A is a functional block diagram of an embodiment of a memory die.

FIG. 2A is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuits 310, and read/write circuits 328, all of which are electrical circuits. Memory structure 326 is addressable by word lines via a row decoder 324 and by bit lines via a column decoder 332. The read/ write circuits 328 include multiple sense blocks 350 including SB1, SB2, . . . , SBp (sensing circuits) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller and the memory die 300 via lines 318, which may form a bus between memory die 300 and the controller (e.g., memory bus 294). In one embodiment, memory die 300 includes a set of input and/or output (I/O) pins that connect to lines 318.

Control circuits 310 cooperate with the read/write circuits 328 to perform memory operations (e.g., write, read, erase, and others) on memory structure 326. In one embodiment, control circuits 310 includes a state machine 312, an on-chip address decoder 314, a power control module 316 (power control circuit) and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuits 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuits 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuits 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three-dimensional memory array of nonvolatile memory cells in which multiple memory levels are formed above a single substrate, such as a wafer. The memory structure may comprise any type of nonvolatile memory that is monolithically formed in one or more physical levels of arrays of memory cells having an active area disposed above a silicon (or other type of) substrate. In one example, the nonvolatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two-dimensional memory array of nonvolatile memory cells. In one example, the nonvolatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

In one embodiment, the control circuit(s) (e.g., control circuits 310) are formed on a first die, referred to as a control die, and the memory array (e.g., memory structure 326) is formed on a second die, referred to as a memory die. For example, some or all control circuits (e.g., control circuit 310, row decoder 324, column decoder 332, and read/write circuits 328) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
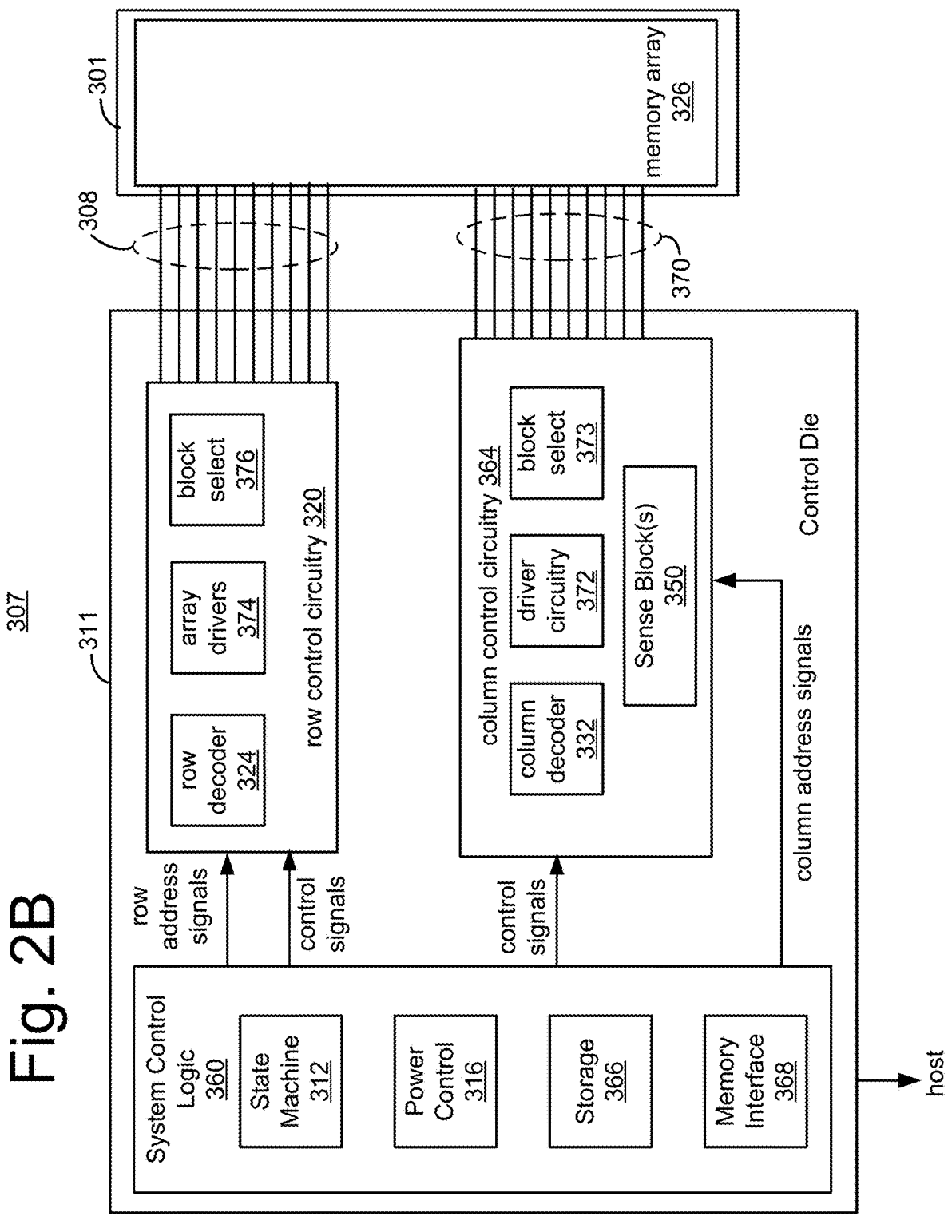
FIG. 2B is a functional block diagram of an embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package 104 in memory system 100. The integrated memory assembly 307 includes two types of semiconductor die (or more succinctly, "die"). Memory die 301 includes memory array 326 (memory structure). Memory array 326 may contain nonvolatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory structure die 301.

In some embodiments, there is more than one control die 311 and/or more than one memory die 301 in an integrated memory assembly 307. In some embodiments, the integrated memory assembly 307 includes a stack of multiple control die 311 and multiple memory structure die 301. In some embodiments, each control die 311 is affixed (e.g., bonded) to at least one of the memory structure dies 301.

The exact type of memory array architecture or memory cell included in memory structure 326 is not limited to the examples above. Many different types of memory array architectures or memory cell technologies can be used to form memory structure 326. No particular nonvolatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
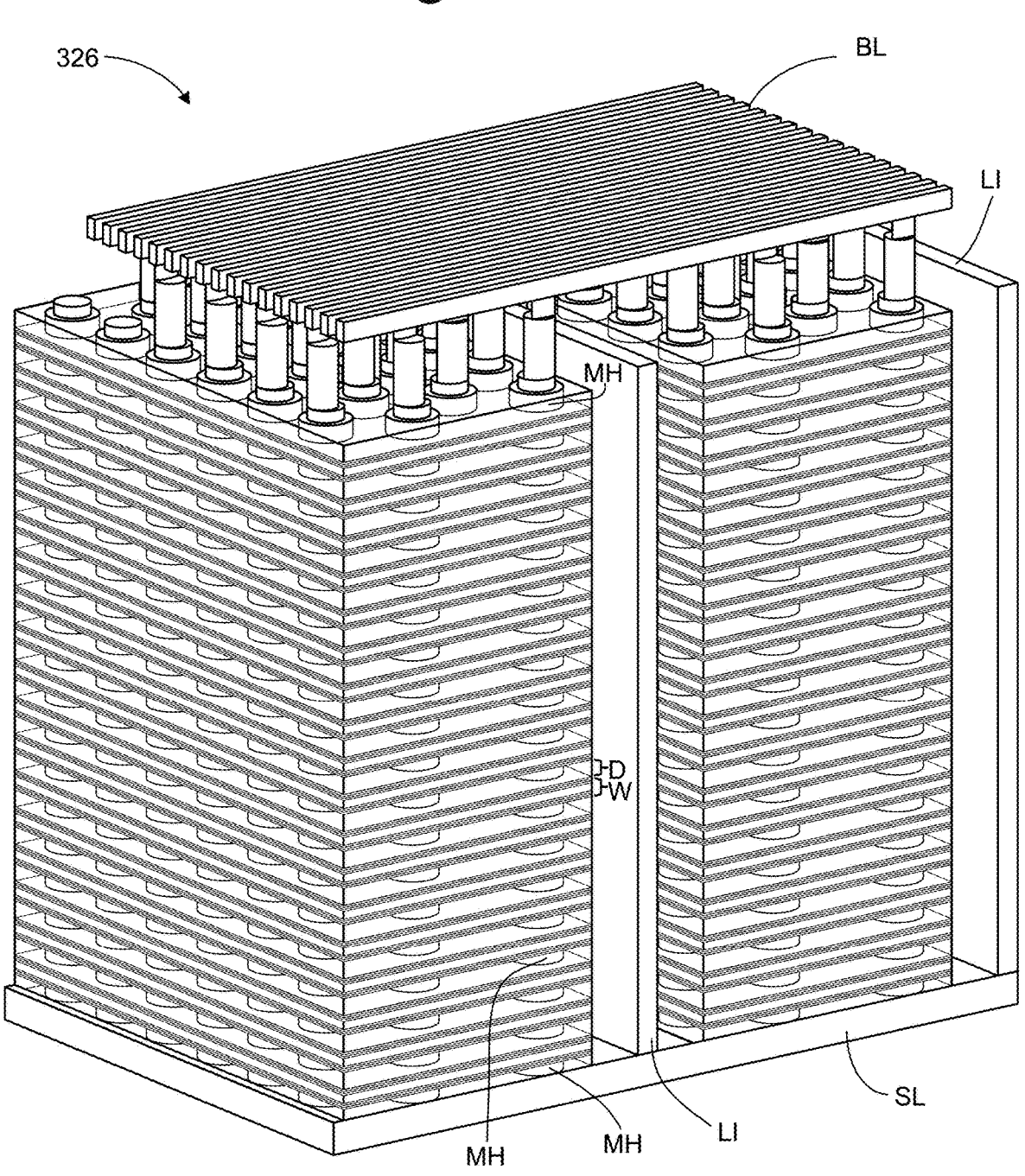
FIG. 3 is a perspective view of a portion of one embodiment of a monolithic three-dimensional memory structure.

FIG. 3 is a perspective view of a portion of one example embodiment of a monolithic three-dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

More or fewer than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory array that comprises memory structure 326 is provided below with respect to FIG. 4A-4C.

Figure 4A:
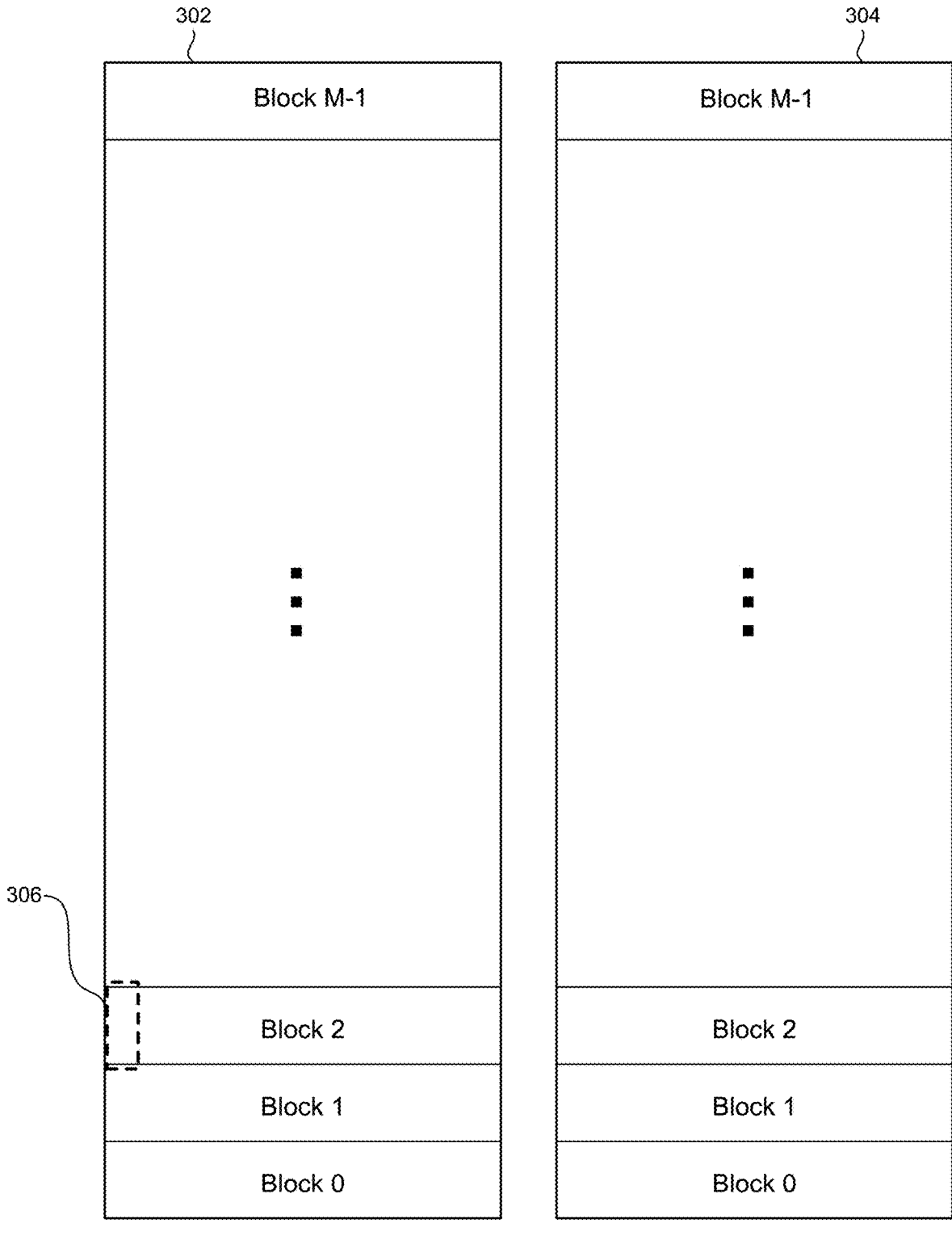
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 4B:
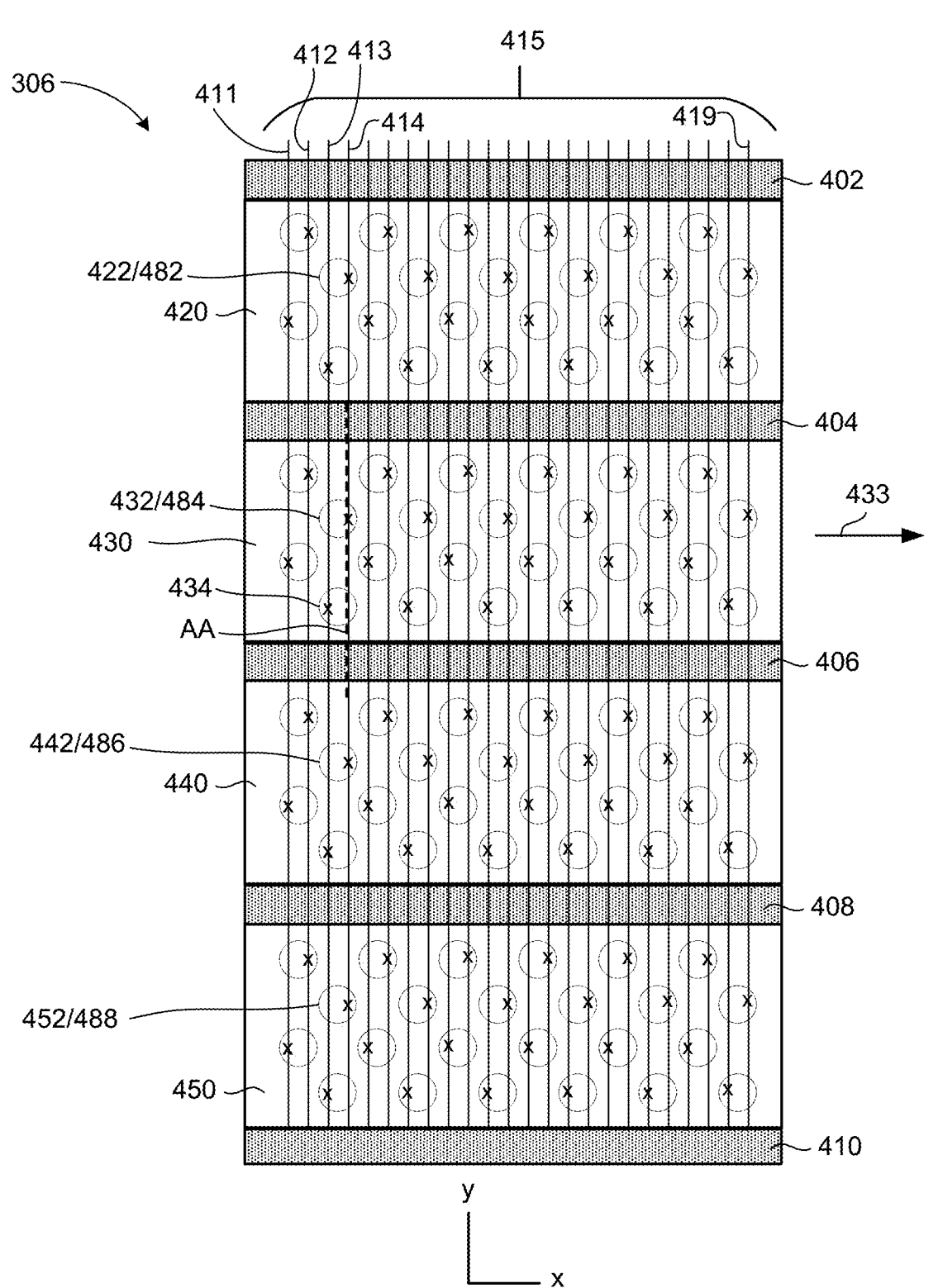
FIG. 4B depicts a top view of a portion of a block of memory cells.

FIGS. 4B-4C depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 433. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines may be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts a portion of one embodiment of a three-dimensional memory structure 326 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty-eight data word line layers WLL0-WLL127 for connecting to data memory cells. Other embodiments can implement more or less than four drain side select layers, more or less than four source side select layers, more or less than four dummy word line layers, and more or less than one hundred- and twenty-eight-word line layers. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 418. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The nonvolatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Although the example memory system of FIGS. 3-4C is a three-dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

Figure 5:
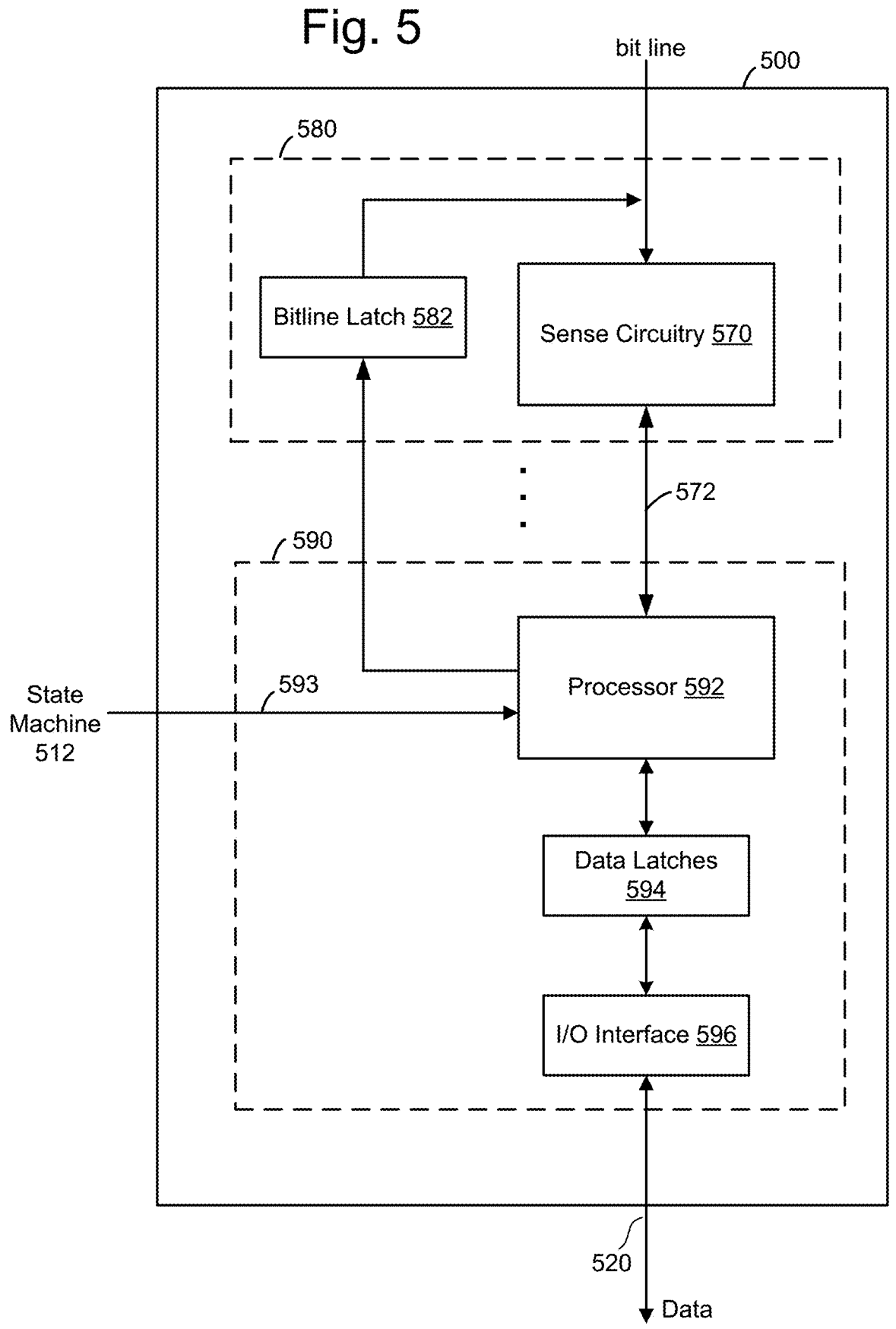
FIG. 5 shows an example of a sense block.

FIG. 5 depicts one embodiment of a sense block 500, such as sense block 350 in FIGS. 2A-B. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. Processor 592 may also move data between latches and perform operations on data in latches (e.g., performing logic operations such as Exclusive OR (XOR) operations. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O Interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via data bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify operation.

Data latches 594 include a stack of data latches corresponding to the sense module. In one embodiment, there are three or more data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 6:
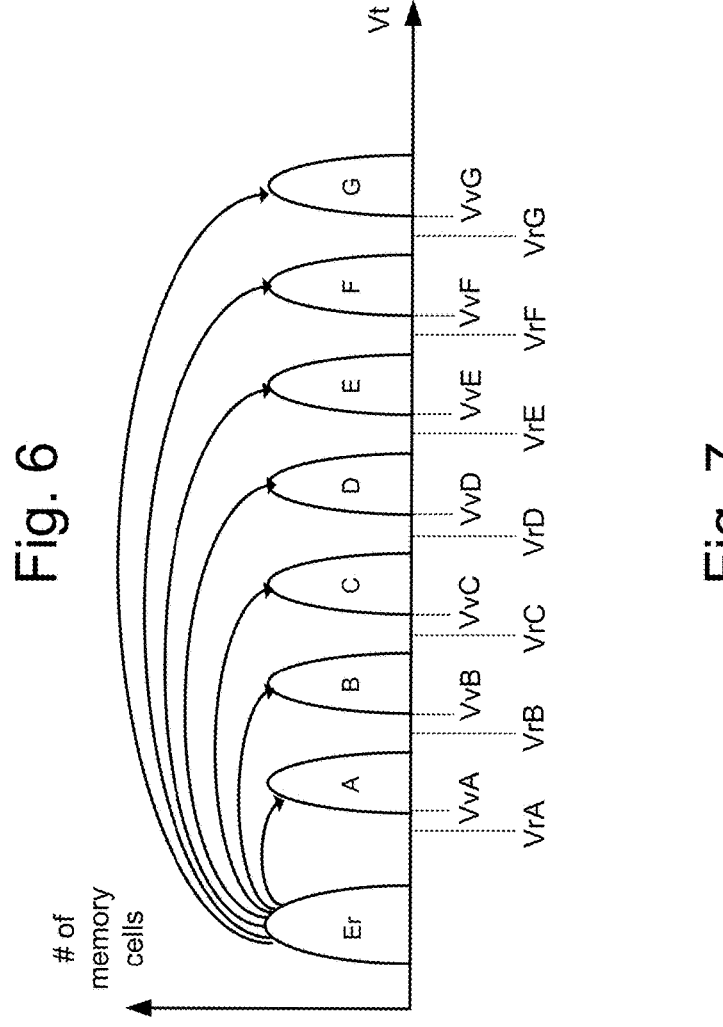
FIG. 6 shows an example of programming multiple data states of nonvolatile memory cells.

FIG. 6 illustrates an example threshold voltage distributions for the memory array when each memory cell stores three bits of data. Other embodiments may use other data capacities per memory cell (e.g., such as one, two, four, or five bits of data per memory cell). Storing more than one bit of data per memory cell using more than two data states is referred to as Multi-Level Cell (MLC), e.g., storing two bits per cell using four data states is an example of MLC. Storing one bit of data per memory cell using two data states is referred to a Single-Level Cell (SLC). Storing four bits of data per memory cell using sixteen data states is referred to as Quad-Level Cell (QLC). FIG. 6 shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits.

FIG. 6 shows seven verify reference voltages, VvA, VvB, VvC, VvD, VVE, VvF, and VvG. When programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC, and so on up to state G.

FIG. 6 also shows seven read reference voltages, VrA, VrB, VrC, VrD, VrE, VrF, and VrG for reading data from memory cells. By testing whether the threshold voltage of a given memory cell is above or below the seven read reference voltages (e.g., performing sense operations using a sense block such as sense block 350), the system can determine which data state (e.g., Er, A, B, C, . . . ) a memory cell is in. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. While FIG. 6 shows all data states being programmed from the erased state together, in other examples, particularly with large numbers of data states, programming may be performed in multiple operations.

Figure 7:
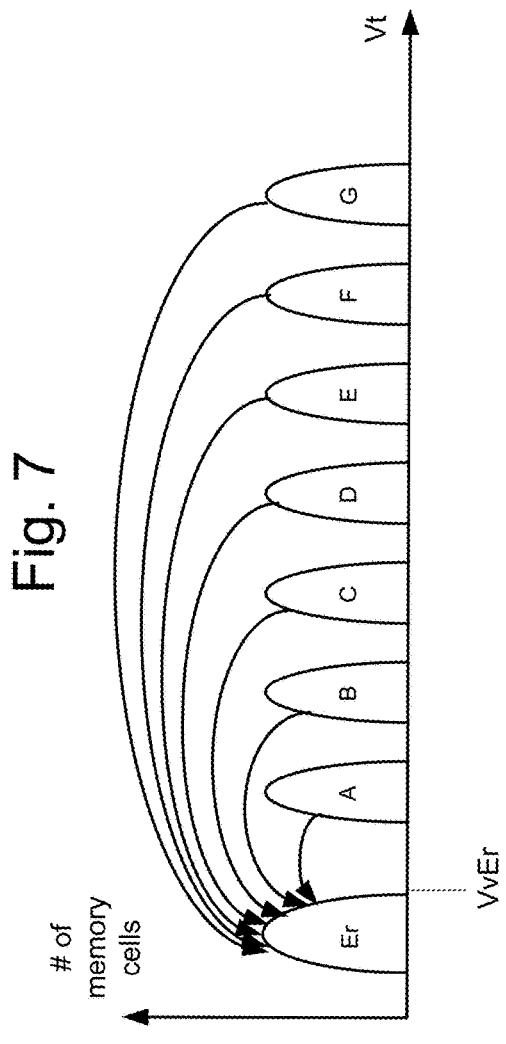
FIG. 7 shows an example of erasing nonvolatile memory cells.

FIG. 7 shows an example of erasing the memory array when each memory cell stores three bits of data (e.g., erasing the memory cells programmed in FIG. 6). Memory cells that were programmed to data states A-G (e.g., by increasing their threshold voltages to the ranges shown) are returned to the erased data state Er (e.g., by reducing their threshold voltages. Erase pulses may be applied to memory cells. Memory cells may be verified as being in data state Er using an erase verify voltage. VvEr, as shown. A set of memory cells may be considered erased when all, or substantially all (e.g., more than 99%) of the memory cells are found to have threshold voltages below VvEr. Memory cells may be erased by charging channels up to a positive voltage and applying an erase-enable voltage, Ven (e.g., 0 volts) on word lines to create a sufficient electric field to move charge from charge storage elements of memory cells.

In an example of an erase scheme, an erase-enable voltage (e.g., Ven) is applied on all word lines of a block to erase memory cells of all word lines of the block in parallel. Such an erase scheme erases memory cells of all word lines uniformly and may be referred to as a uniform erase or all-word line erase scheme.

In alternative erase scheme, an erase-enable voltage is applied non-uniformly. For example, an erase-enable voltage, Ven (e.g., 0 volts) may be applied to a first subset of word lines of a block while an erase-inhibit voltage, Vinh (e.g., 10 volts) is applied to a second subset of word lines of the block. This causes memory cells of the first subset of word lines to be erased without erasing memory cells of the second subset of word lines. Subsequently, the erase-enable voltage is applied to the second subset of word lines and the erase-inhibit voltage is applied to the first subset of word lines to erase memory cells of the second subset of word lines. Such an erase scheme that erases memory cells non-uniformly may be referred to as a non-uniform erase scheme. Word lines may be erased in any number of subsets (e.g., two, three, four, or more subsets) that may be in any arrangement (e.g., alternating, interleaved, or other arrangement). In an example, word lines are grouped into two subsets in an alternating pattern, with a first subset including odd numbered word lines and a second subset including even numbered word lines. An erase scheme (non-uniform erase scheme) that separately erases odd word lines and even word lines may be referred to as an odd-even erase scheme.

FIGS. 8A-8C depict examples of word line voltages in different erase processes. In the all word line erase shown in FIG. 8A, all of the word lines are held at a low, erase-enable voltage (Ven) such as 0 V while the channels of the NAND strings are charged up. This creates a large channel-to-control gate electric field for each of the memory cells, which drive hole injection into the trapping layer, lowering the Vth of the memory cells. In the odd-even word line erase of FIG. 8B, the odd-numbered word lines are held at Ven and the even-numbered word lines are held at a higher, erase-inhibit voltage (Vinh) such as 10 V, while the channels are charged up. With Ven applied to the word lines, this creates a large channel-to-control gate electric field for each of the memory cells connected to the odd-numbered word lines so that the memory cells connected to the odd-numbered word lines are erased. However, with Vinh applied to the even-numbered word lines, the channel-to-control gate electric field is not large enough for an erase so that the memory cells connected to the even-numbered word lines are not erased. Separately, either before or after the erasing of the memory cells connected to the odd-numbered word lines, the even-numbered word lines are held at Ven and the odd-numbered word lines are held at Vinh while the channels are charged up, so that the memory cells connected to the even-numbered word lines are erased while the memory cells connected to the odd-numbered word lines are not erased (e.g., FIG. 8C).

Additionally, when odd-even word line erase is used, the verify process can involve a concurrent verify test for all of the memory cells, so that the verify test for the memory cells connected to the odd-numbered word lines is concurrent with the verify test for the memory cells connected to the even-numbered word lines. Or, the verify process can involve a verify test for the memory cells connected to the odd-numbered word lines which is separate, either before or after, a verify test for the memory cells connected to the even-numbered word lines.

FIG. 8A depicts word line voltages in an all word line erase process. Ven=0 V, for example, is applied to all of the data word lines WL0-WL127 (e.g., as previously shown in FIG. 4C) so that the memory cells connected to these word lines, including the memory cells 703-714, are erased. The dummy word lines can receive Vinh. The channel 700a of the NAND can be charged up from the source end by applying an erase voltage to the substrate and/or from the drain using GIDL.

FIG. 8B depicts word line voltages in an odd-numbered word line erase step. Ven=0 V is applied to the odd-numbered word lines, e.g., WL1, WL3 . . . . WL127 while Vinh=10 V is concurrently applied to the even-numbered word lines, e.g., WL0, WL2 . . . . WL126.

FIG. 8C depicts word line voltages in an even-numbered word line erase step. Ven=0 V is applied to the even-numbered word lines, e.g., WL0, WL2 . . . . WL126 while Vinh=10 V is concurrently applied to the odd-numbered word lines, e.g., WL1, WL3 . . . . WL127.

FIG. 8D depicts word line voltages in an all word line verify process. A verify voltage, VvEr, is applied to each of the word lines concurrently while sensing a current in the NAND string. The all word line verify process may be beneficial in terms of time consumed compared to the odd-even verify process.

FIG. 8E depicts word line voltages in an odd-numbered word line verify step. The memory cells connected to the odd-numbered word lines are subject to a verify test by applying a verify voltage VvEr to these word lines. A pass voltage, Vread, such as 8 V, is applied to the even-numbered word lines during the verify test to provide the associated memory cells in a strongly conductive state so that the sensed current in the NAND string will be primarily based on the threshold voltages of the memory cells connected to the odd-numbered word lines.

FIG. 8F depicts word line voltages in an even-numbered word line verify step. The memory cells connected to the even-numbered word lines are subject to a verify test by applying a verify voltage VvEr to these word lines. Vread is applied to the odd-numbered word lines during the verify test to provide the associated memory cells in a strongly conductive state so that the sensed current in the NAND string will be primarily based on the threshold voltages of the memory cells connected to the even-numbered word lines. The odd-even verify process may ensure that the memory cells are uniformly erased.

In some cases, control circuits (e.g., in controller 102) connected to a nonvolatile memory may attempt to determine a state of one or more blocks in the nonvolatile memory. For example, when power is lost without sufficient time to prepare a block for power loss, the condition (e.g., written, partially written, erased, partially erased) of a block (e.g., block that may have been undergoing write or erase operations when power was lost) may not be recorded in nonvolatile memory and may not be easily available after power returns. Control circuits may check the individual blocks to determine their condition (e.g., whether there is any data). Suitable schemes to check the condition of such blocks may be more challenging in cases where a non-uniform erase scheme is used than where only a uniform erase scheme is used.

FIGS. 9A-D illustrate examples of blocks in different conditions (e.g., conditions that may be encountered when control circuits attempt to determine block conditions after power is restored after power loss).

FIG. 9A illustrates an example of a block 900 (e.g., in memory structure 326) which is partially written. A written portion 902 of block 900 is indicated by shading while the unwritten portion 904 is shown as blank. A boundary 906 extends between written portion 902 and unwritten portion 904. For example, a word line immediately below boundary 906 may be written while a word line immediately above boundary 906 may be unwritten. Programming may proceed from word line to word line in a predetermined order (from bottom to top in FIG. 9A). The logical order of programming shown in FIG. 9A may or may not correspond to the physical order (e.g., programming may proceed from word lines that are physically higher to word lines that are physically lower, or in some other order). As programming progresses, the size of written portion 902 increases while the size of unwritten portion 904 decreases and boundary 906 moves accordingly. In some cases, the condition of an open block (a block that is not yet closed or full and is available for writing data) may not be recorded in nonvolatile memory prior to an unexpected loss of power. When power is returned, a determination may be made as to whether there is data stored in the block and, if so, where the boundary between written and unwritten portions is located. Any data stored in such a block may be maintained or copied to a new location.

FIG. 9B shows an example of block 900 after it is completely written (e.g., all word lines of block 900 are written) so that written portion 902 extends throughout block 900. Because there is no unwritten portion in this case, there is no boundary between written and unwritten portions. A block may be closed when it is fully written and its condition as closed may be recorded in nonvolatile memory.

FIG. 9C shows an example of block 900 after it is completely erased (e.g., after all word lines of block 900 are erased in a uniform or non-uniform erase) so that unwritten portion 904 extends throughout block 900. Because there is no written portion in this case, there is no boundary between written and unwritten portions. A block that is fully erased may be prepared for subsequent use (e.g., for storing data) and its condition may be recorded in nonvolatile memory (e.g., it may be added to an erased block pool). In some cases, an unexpected power loss may occur prior to recording the erased condition of a block (e.g., a block as shown in FIG. 9C).

In memory systems that use only uniform (all word line) erase, detection of a boundary between written and unwritten portions (e.g., boundary 906) may be sufficient to determine that a block is partially written. Detecting a boundary between written and unwritten portions may not be sufficient to indicate a partially written block in memory systems that use non-uniform erase (e.g., odd-even erase).

FIG. 9D shows an example of block 900 at an intermediate stage during odd-even erase (e.g., subsequent to odd word line erase step of FIG. 8B and prior to even word line erase step of FIG. 8C). Odd word lines (e.g., WL1, WL3, WL5 . . . ) are erased (unwritten) while even word lines (e.g., WL0, WL2, WL4 . . . ) are not erased (written). This alternating pattern creates multiple boundaries between written and unwritten portions. For example, in addition to boundary 908 between WL4 (written) and WL (unwritten), FIG. 9D shows boundary 910 between WL2 (written) and WL3 (unwritten). The odd word line erase of block 900 of FIG. 9D provides eleven such boundaries between written and unwritten portions. In other non-uniform erase schemes, the number and locations of such boundaries may be different. A pattern of written and unwritten portions with multiple boundaries (e.g., as shown in FIG. 9D or otherwise) may occur as a result of an erase abort (e.g., loss of power during odd-even erase) and may be challenging to identify when attempting to determine the condition of a block.

Figure 10B:
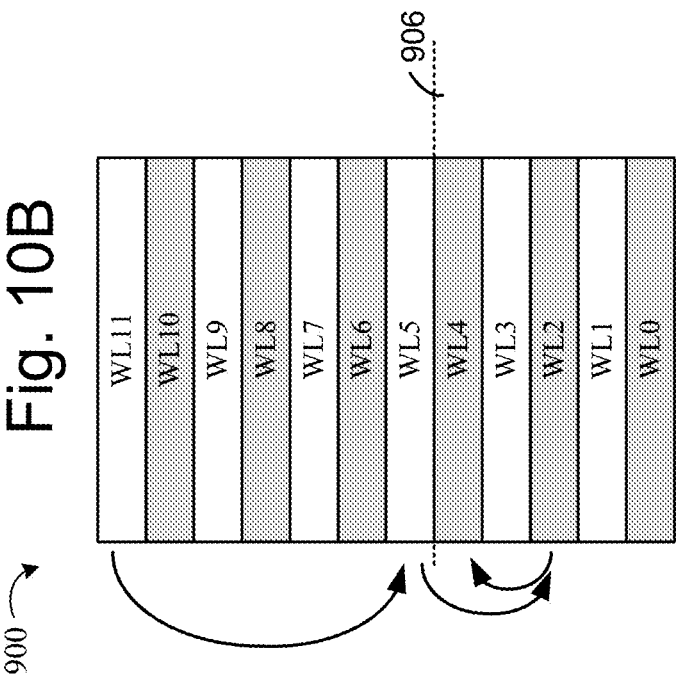
FIGS. 10A-B show examples of a binary search for a boundary in a block.
Figure 10A:
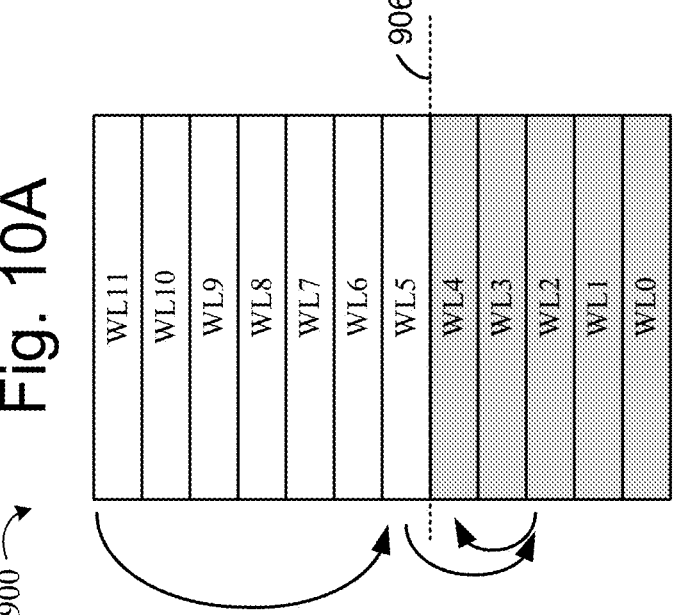

FIG. 10A illustrates an example of a binary search for a boundary in block 900 when it is partially written (e.g., as shown in FIG. 9A). The binary search starts by checking (e.g., performing a read or verify operation on) the last logical word line (WL11) to determine if the block is fully written. In response to determining that WL11 is unwritten, a word line in the middle of the block (WL5) is checked. In response to determining that WL5 is unwritten, a word line in the middle of the remaining portion of the block below WL5 (WL2 in this example) is checked. In response to determining that WL2 is written (indicating a boundary somewhere between WL2 and WL5), a word line in the middle of the remaining portion (WL4 in this example) is checked. In response to determining that WL4 is written, it is determined that boundary 906 is located between WL4 and WL5. In response, it may be assumed that a write abort occurred and data stored at WL0-WL4 may be copied to another block.

FIG. 10B illustrates an example of a binary search for a boundary in block 900 when it is partially erased by a non-uniform erase (e.g., after odd word line erase step of FIG. 8B and prior to even word line erase step of FIG. 8C). The binary search starts by checking (e.g., performing a read or verify operation on) the last logical word line (WL11) to determine if the block is fully written. In response to determining that WL11 is unwritten, a word line in the middle of the block (WL5) is checked. In response to determining that WL5 is unwritten, a word line in the middle of the remaining portion of the block below WL5 (WL2) is checked. In response to determining that WL2 is written (indicating a boundary somewhere between WL2 and WL5), a word line in the middle of the remaining portion (WL4 in this example) is checked. In response to determining that WL4 is written, it is determined that boundary 906 is located between WL4 and WL5 (same result as for FIG. 10A). In response, it may be assumed that a write abort occurred and data stored at WL0-WL4 may be copied to another block. However, in the scenario shown in FIG. 10B, no valid data is located at WL0-WL4 (WL0 and WL3 are erased while WL0, WL2 and WL4 have only obsolete data). Such mis-identification of a partially written block may be undesirable because it results in unnecessary copying of obsolete data and may impact time to recover from an unexpected power loss.

Aspects of the present technology are directed to techniques for accurately and efficiently determining the condition of a block including identifying a block that is partially erased in an aborted non-uniform erase (e.g., odd-even erase).

Figures 11A, 11B:
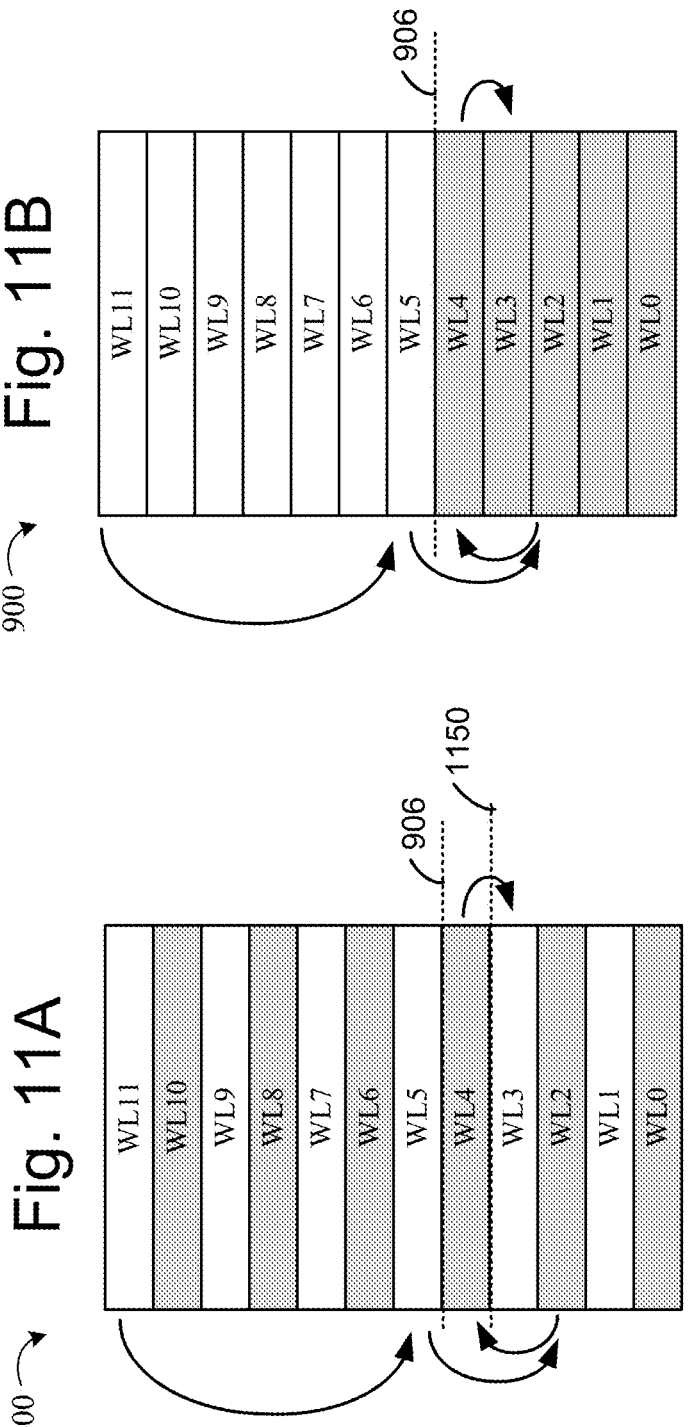
FIGS. 11A-B show examples of determining a condition of a block.

FIGS. 11A-B show examples of schemes for determining the condition of block 900, which includes distinguishing between a partially erased block (e.g., after partial non-uniform erase) and a partially written block (e.g., after a write abort). FIG. 11A shows block 900 after partial non-uniform erase with only odd word lines erased. A binary search is used initially (as shown in FIGS. 10A-B) to detect a boundary, starting with WL11, then WL5 (both erased or unwritten) and then WL2 and WL4 (both written). Because WL4 is written and WL5 is unwritten, it is determined that there is a boundary 906 (first boundary) between WL4 and WL5. In order to further identify the condition of block 900, FIG. 11A shows checking the word line immediately adjacent to the last written word line found by the binary search, WL4 (which is WL3, in this example), to see if it is written or unwritten (e.g., to search for a second boundary below WL4). Because the test word line, WL3, is unwritten and a second boundary 1150 is located between WL3 and WL4, it is determined that block 900 is partially erased and block 900 may be treated accordingly (e.g., may be prepared for use, which may include filling with data and/or completing erase).

The approach used in FIG. 11A uses a binary search to find a first boundary between written and unwritten portions and then checks a test word line below (on the written side) of the last written word line found by the binary search to see if there is a second boundary, which would indicate non-uniform erase. The test word line selected in this example (WL3) is immediately adjacent to the last written word line found in the binary search (WL4) in this example (e.g., offset by one word line). An offset of one word line may be appropriate for a memory system that uses odd-even erase. In other examples (e.g., using other non-uniform erase), a search for a second boundary may be performed differently. For example, the test word line (or word lines) used to test for non-uniform erase may be selected differently (e.g., offset by a different amount).

FIG. 11B shows block 900 partially written (e.g., after write abort) with valid data along WL0-WL4. The same binary search is used initially (same as FIG. 11A) to detect a boundary, starting with WL11, then WL5 (both erased or unwritten) and then WL2 and WL4 (both written). Because WL4 is written and WL5 is unwritten, it is determined that there is a boundary 906 between WL2 and WL5. FIG. 11B shows checking the word line immediately adjacent to the last written word line found by the binary search, WL4 (which is WL3, in this example), to see if it is written or unwritten (e.g., to search for a second boundary below WL4). Because WL3 is written, no second boundary is located between WL3 and WL4 and it is determined that block 900 is partially written. Block 900 may be treated accordingly (e.g., may be prepared for use, which may include writing additional data in WL5-WL11 or copying valid data from WL0-WL4 to another block).

Figure 12B:
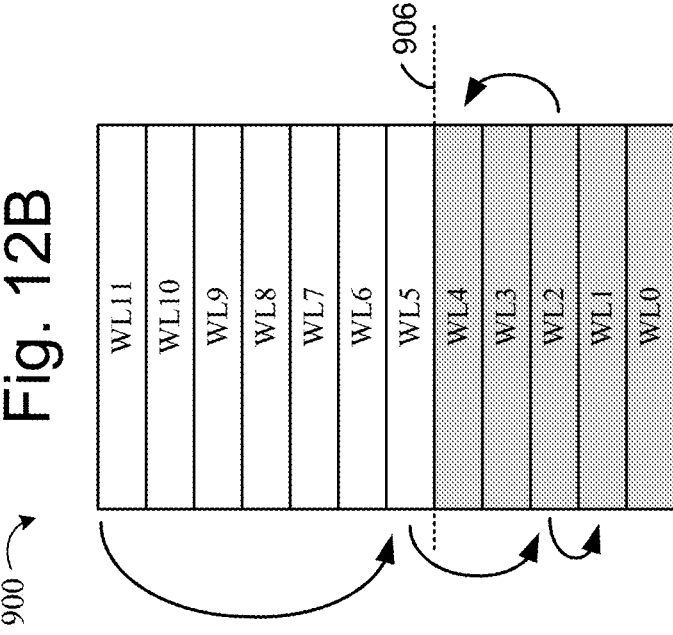
FIGS. 12A-B show examples of determining a condition of a block.
Figure 12A:
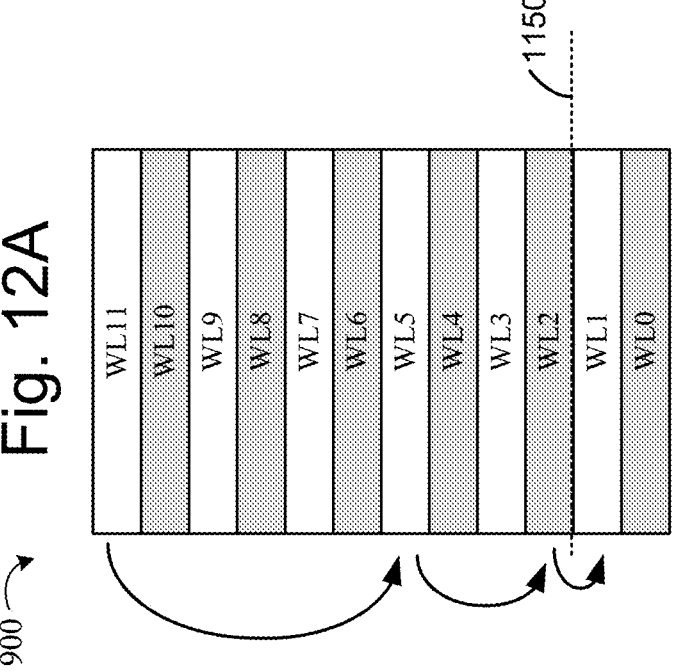

FIG. 12A shows an alternative implementation to that shown in FIGS. 11A-B. A binary search is used initially (as shown in FIGS. 11A) to detect a boundary, starting with WL11, then WL5 (both erased or unwritten) and then WL2 (written). Because WL2 is written and WL5 is unwritten, there must be a boundary (e.g., boundary 906) between WL2 and WL5 although its location is not determined at this point. The binary search may detect the boundary by identifying at least one written word line and at least one unwritten word line (not necessarily the exact location of the boundary). Rather than continue the binary search to determine the location of the boundary (e.g., checking WL4 as in FIG. 11A), FIG. 11B shows checking the word line immediately adjacent to WL2 (WL1) to see if it is written or unwritten (e.g., to search for a second boundary below WL2). Because WL1 is unwritten, a second boundary 1150 is located between WL1 and WL2 and it is determined that block 900 is partially erased. Block 900 may be treated accordingly (e.g., may be prepared for use, which may include filling with data and/or completing erase). Thus, in this example, the binary search does not complete (e.g., the location of the first boundary is not precisely determined) before checking for a second boundary.

FIG. 12B shows the same implementation as FIG. 12A applied to block 900 when it is partially written (e.g., after write abort) with valid data along WL0-WL4. The same binary search is used initially (same as FIG. 12A) to detect a boundary, starting with WL11, then WL5 (both erased or unwritten) and then WL2 (written). Because WL2 is written and WL5 is unwritten, there must be a boundary (e.g., boundary 906) between WL2 and WL5. Rather than immediately continuing the binary search to determine the location of the boundary, FIG. 12B shows checking the word line immediately adjacent to WL2 (WL1) to see if it is written or unwritten (e.g., to search for a second boundary below WL2). Because WL1 is written, no second boundary is located between WL1 and WL2 and it is determined that block 900 is partially written. The binary search may then be continued by searching between WL2 and WL5. Checking WL4 indicates that WL4 is written from which it may be determined that boundary 906 lies between WL4 and WL5. This indicates that valid data is present in WL0-WL4 of block 900. Block 900 may be treated accordingly (e.g., valid data may be copied from WL0-WL4 prior to erasing block 900).

FIG. 13 shows an example of a method that includes identifying an open block of a nonvolatile memory 1360 and detecting a first boundary between written and unwritten portions of the open block 1362 (e.g., by performing a binary search of the open block). The method further includes, subsequently, in response to detecting the first boundary between the written and unwritten portions of the open block, checking for a second boundary between written and unwritten portions of the open block to determine if the open block was subject to a non-uniform erase operation 1364 (e.g., checking a test word line that is a predetermined offset from a detected written word line).

Figure 14:
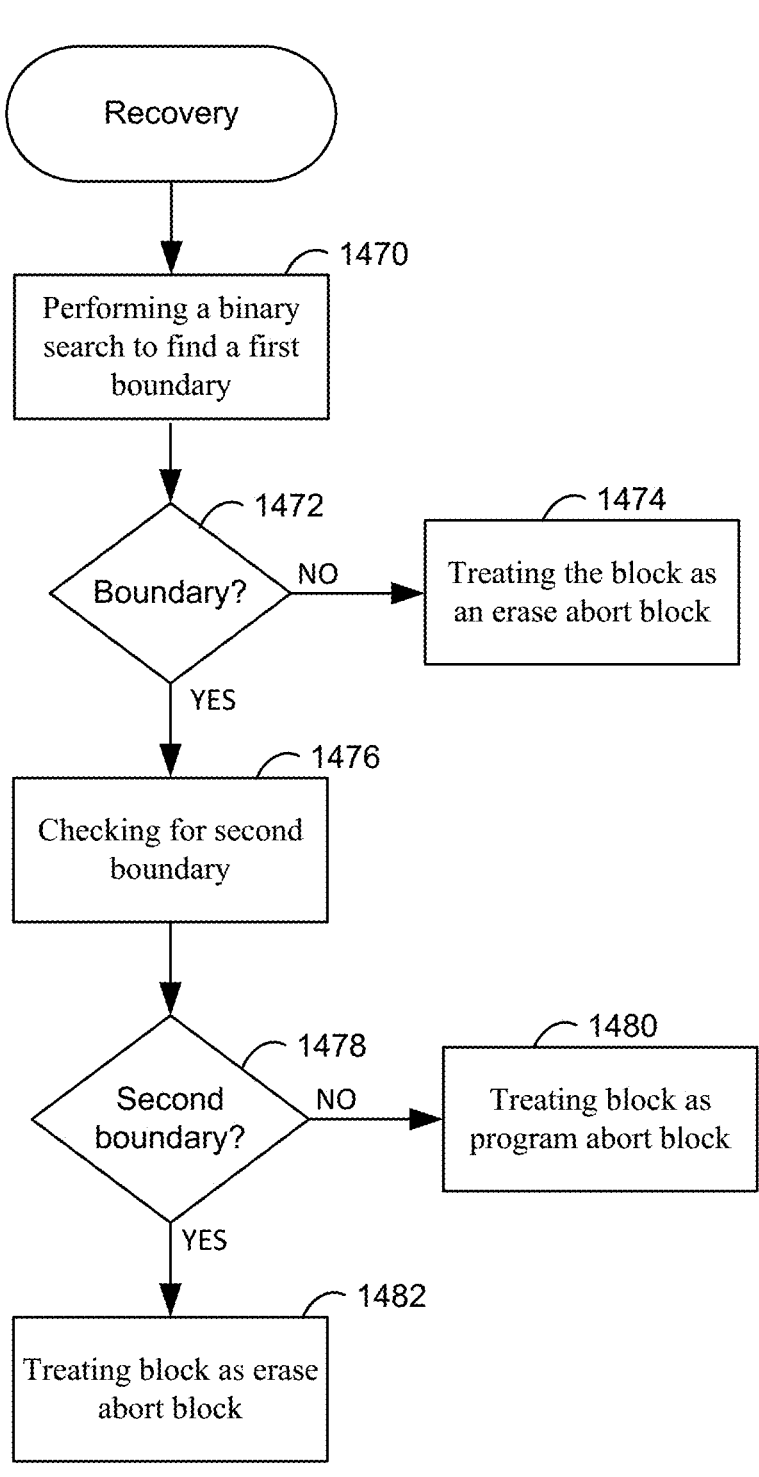
FIG. 14 shows an example of a method that includes checking for a second boundary in a block.

FIG. 14 shows an example of a method of recovering after a power loss that includes performing a binary search to find a first boundary 1470. A determination is made as to whether a boundary is detected 1472 (first boundary may not be precisely located at this time). If no boundary is detected at step 1472 then the method includes treating the block as an erase abort block 1474 (e.g., block may be checked to see if it is fully erased and made available for writing or further erased accordingly). If a boundary (first boundary) is detected then the method includes checking for a second boundary 1476 and determining if a second boundary is present 1478. For example, a test word line below a written word line (in logical order of programming) may be checked to see if it is unwritten. If no second boundary is present then the block is treated as a program abort block 1480, which may include continuing programming of unprogrammed word lines or copying valid data to another block. If a second boundary is present then the block is treated as an erase abort block 1482 (e.g., block that was partially erased in a non-uniform erase). For example, in response to determining that the open block was subject to a non-uniform erase operation the block may be prepared for erase without copying data from the open block.

Figure 15:
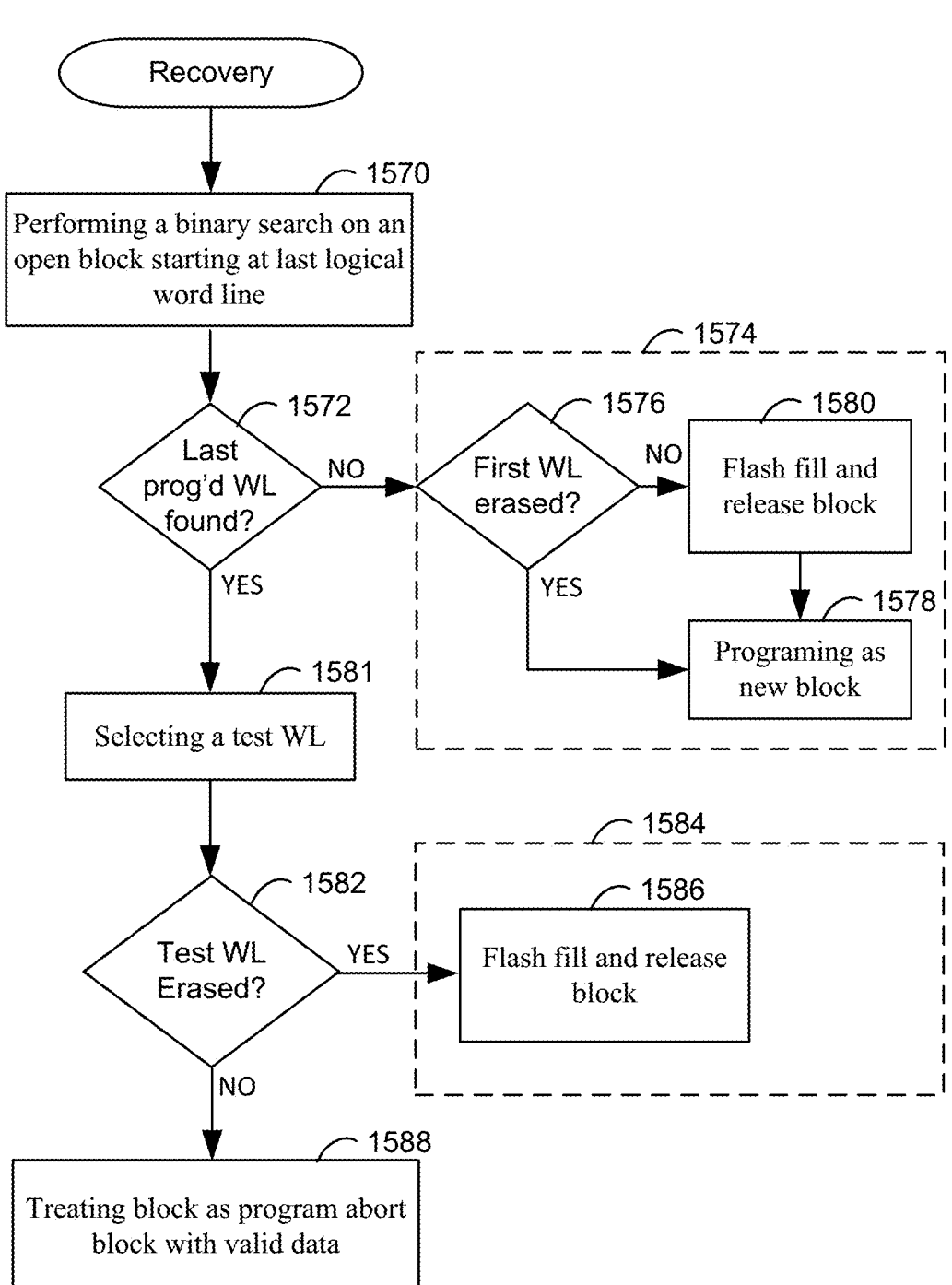
FIG. 15 shows an example of a method that includes determining if a test word line is erased.

FIG. 15 illustrates an example of a method of recovering after a power loss that includes performing a binary search on an open block starting at the last logical word line 1570. For example, WL127 of FIGS. 8A-F or WL11 of block 900 (where word lines are programmed according to number starting at zero, e.g., WL0, WL1, WL2 . . . ). A determination is made as to whether a last programmed word line was found 1572 (e.g., determination as to whether a boundary is present between a written portion and an unwritten portion). If no last programmed word line is found then the block is treated as an erase abort block 1574 (e.g., uniform erase abort or odd-even erase abort after both even and odd word lines are at least partially erased). This includes making a determination as to whether a first word line is erased 1576 (first word line in order of programming, e.g., WL0). If the first word line is fully erased then the block may be made available for programming as a new block 1578 (e.g., treated as a fully-erased block that is available for programming). If the first word line is not fully erased then the block may be flash filled and released 1580 before programming. Steps 1576, 1578 and 1580 provide an example of treating a block as an erase abort block 1574. Other treatments are possible.

When a last programmed word line is found 1572 the method includes selecting a test word line 1581 and determining if the test word line is erased 1582. For example, the test word line may be a predetermined offset away from the last programmed word line (e.g., one word line offset for a system using odd-even erase). If the test word line is erased then the block is treated as a partially erased block 1584 (e.g., block that was partially erased by non-uniform erase such as odd-even erase). In this example, the block is flash filled and released 1586. In other examples, partially erased blocks may be treated differently. If the test word line is erased then the method includes treating the block as a program abort block with valid data 1588.

Methods described above (e.g., in FIGS. 11A-15) may be implemented in any suitable manner, including by suitably configured control circuits. Control circuits 310, alone or in combination with read/write circuits 328 and decoders 324/332, comprise one or more control circuits for memory structure 326. These one or more control circuits are electrical circuits that perform the functions described above in the flow charts. In other embodiments, the one or more control circuits can consist only of controller 102, which is an electrical circuit in combination with software, that performs the functions described above in the flow charts. In another alternative, the one or more control circuits comprise controller 102 and control circuits 310 performing the functions described above in the flow charts. In another embodiment, the one or more control circuits comprise state machine 312 (or a microcontroller or microprocessor) alone or in combination with controller 102. Any such control circuits configured appropriately (e.g., by hardware configuration or a combination of hardware and software configuration) may be considered examples of means for detecting a first boundary between written and unwritten portions of an open block and in response to detecting the first boundary checking for a second boundary between written and unwritten portions of the open block to determine if the open block was subject to a non-uniform erase operation An example of an apparatus includes one or more control circuits that are configured to connect to a plurality of nonvolatile memory cells. The one or more control circuits may be configured to detect a first boundary between written and unwritten portions of an open block. And may be further configured to, in response to detecting the first boundary, check for a second boundary between written and unwritten portions of the open block to determine if the open block was subject to a non-uniform erase operation.

The one or more control circuits may be configured to detect the first boundary by performing a binary search of word lines of the open block until at least one written word line is identified and at least one unwritten word line is identified. The one or more control circuits may be configured to check for the second boundary by reading a test word line that is a predetermined offset from a detected written word line. The non-uniform erase operation may be an odd-even erase operation that separately erases odd word lines and even word lines and the test word line may be immediately adjacent to the detected written word line. The one or more control circuits may be configured to prepare the open block for erase without copying data from the open block in response to determining that the test word line is erased. The one or more control circuits may be further configured to find a location of the first boundary in response to finding no second boundary between written and unwritten portions of the open block is found. The one or more control circuits may be further configured to copy data on a written side of the first boundary from the open block to another block if no second boundary between written and unwritten portions of the open block is found. The one or more control circuits may be configured to prepare the open block for erase without copying data from the open block in response to determining that the open block was subject to a non-uniform erase operation. The one or more control circuits may be located on a control die that is configured to be connected to a memory die that includes the plurality of nonvolatile memory cells.

An example of a method includes identifying an open block of a nonvolatile memory, detecting a first boundary between written and unwritten portions of the open block, and subsequently, in response to detecting the first boundary between the written and unwritten portions of the open block, checking for a second boundary between written and unwritten portions of the open block to determine if the open block was subject to a non-uniform erase operation.

Detecting the first boundary may include performing a binary search of word lines of the open block until at least one written word line is identified and at least one unwritten word line is identified. Checking for the second boundary may include reading a test word line that is a predetermined offset from a detected written word line. The non-uniform erase operation may be an odd-even erase operation that separately erases odd word lines and even word lines and the test word line may be immediately adjacent to the detected written word line. The method may further include preparing the open block for erase without copying data from the open block in response to determining that the test word line is erased. The method may further include finding a location of the first boundary in response to finding no second boundary between written and unwritten portions of the open block. The method may further include copying data on a written side of the first boundary from the open block to another block in response to finding no second boundary between written and unwritten portions of the open block. The method may further include preparing the open block for erase without copying data from the open block in response to determining that the open block was subject to a non-uniform erase operation.

An example of a data storage system includes a plurality of nonvolatile memory cells arranged in blocks; and means for detecting a first boundary between written and unwritten portions of an open block and in response to detecting the first boundary checking for a second boundary between written and unwritten portions of the open block to determine if the open block was subject to a non-uniform erase operation.

The non-uniform erase operation may be an odd-even erase operation that separately erases odd word lines and even word lines and checking for the second boundary between written and unwritten portions may include checking a test word line located immediately adjacent to a word line determined as written. The plurality of nonvolatile memory cells may be located on a memory die and the means for detecting the first boundary may be located on a control die connected to the memory die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a plurality of nonvolatile memory cells that are arranged in blocks,
   the one or more control circuits are configured to:
   detect a first boundary between written and unwritten portions of an open block and in response to detecting the first boundary to check for a second boundary between written and unwritten portions of the open block to determine if the open block is partially-erased by an aborted non-uniform erase operation, the non-uniform erase operation causes different nonvolatile memory cells of the block to be erased at different times such that the aborted non-uniform erase operation leaves written and unwritten portions.

2. The apparatus of claim 1, wherein the one or more control circuits are configured to detect the first boundary by performing a binary search of word lines of the open block until at least one written word line is identified and at least one unwritten word line is identified.

3. The apparatus of claim 2, wherein the one or more control circuits are configured to check for the second boundary by reading a test word line that is a predetermined offset from a detected written word line.

4. The apparatus of claim 3, wherein the non-uniform erase operation is an odd-even erase operation that separately erases odd word lines and even word lines and the test word line is immediately adjacent to the detected written word line.

5. The apparatus of claim 4, wherein the one or more control circuits are configured to prepare the open block for erase without copying data from the open block in response to determining that the test word line is erased.

6. The apparatus of claim 1, wherein the one or more control circuits are further configured to find a location of the first boundary in response to finding no second boundary between written and unwritten portions of the open block is found.

7. The apparatus of claim 6, wherein the one or more control circuits are further configured to copy data on a written side of the first boundary from the open block to another block if no second boundary between written and unwritten portions of the open block is found.

8. The apparatus of claim 1, wherein the one or more control circuits are configured to prepare the open block for erase without copying data from the open block in response to determining that the open block was subject to a non-uniform erase operation.

9. The apparatus of claim 1, wherein the one or more control circuits are located on a control die that is configured to be connected to a memory die that includes the plurality of nonvolatile memory cells.

10. A method comprising:
   identifying a plurality of open blocks of a nonvolatile memory;
   detecting a first boundary between written and unwritten portions of each open block of the plurality of open blocks;
   subsequently, in response to detecting the first boundary between the written and unwritten portions of each open block, checking for a second boundary between written and unwritten portions of each open block to determine if the open block was subject to an aborted non-uniform erase operation;

in response to finding the second boundary in a first open block, identifying the first open block as partially erased by an aborted non-uniform erase operation and preparing the first open block for erase without copying data from the first open block; and in response to failing to find the second boundary in a second open block, identifying the second open block as partially written and copying data from the second open block.

11. The method of claim 10, wherein detecting the first boundary includes performing a binary search of word lines of the open block until at least one written word line is identified and at least one unwritten word line is identified.

12. The method of claim 11, wherein checking for the second boundary includes reading a test word line that is a predetermined offset from a detected written word line.

13. The method of claim 12, wherein the non-uniform erase operation is an odd-even erase operation that separately erases odd word lines and even word lines and the test word line is immediately adjacent to the detected written word line.

14. The method of claim 13, further comprising preparing the open block for erase without copying data from the open block in response to determining that the test word line is erased.

15. The method of claim 10, further comprising finding a location of the first boundary in response to finding no second boundary between written and unwritten portions of the open block.

16. The method of claim 15, further comprising copying data on a written side of the first boundary from the open block to another block in response to finding no second boundary between written and unwritten portions of the open block.

17. The method of claim 11, further comprising preparing the open block for erase without copying data from the open block in response to determining that the open block was subject to a non-uniform erase operation.

18. A data storage system comprising:

a plurality of nonvolatile memory cells arranged in blocks; and means for detecting a first boundary between written and unwritten portions of an open block and in response to detecting the first boundary checking for a second boundary between written and unwritten portions of the open block to determine if the open block was subject to a non-uniform erase operation to erase different nonvolatile memory cells of the block at different times such that an aborted non-uniform erase operation leaves written and unwritten portions in the block.

19. The data storage system of claim 18, wherein the non-uniform erase operation is an odd-even erase operation that separately erases odd word lines and even word lines and checking for the second boundary between written and unwritten portions includes checking a test word line located immediately adjacent to a word line determined as written.

20. The data storage system of claim 18, wherein the plurality of nonvolatile memory cells are located on a memory die and the means for detecting the first boundary is located on a control die connected to the memory die.

* * * * *